(12) United States Patent
Lunt, III et al.

(10) Patent No.: US 12,258,505 B2
(45) Date of Patent: Mar. 25, 2025

(54) GALLIUM INDIUM NITRIDE NANOCRYSTALS

(71) Applicant: Board of Trustees of Michigan State University, East Lansing, MI (US)

(72) Inventors: Richard R. Lunt, III, Williamston, MI (US); Rebecca J. Anthony, Lansing, MI (US); Alexander H. Ho, St. Johns, MI (US); Rajib Mandal, San Jose, CA (US)

(73) Assignee: Board of Trustees of Michigan State University, East Lansing, MI (US)

( * ) Notice: Subject to any disclaimer, the term of this patent is extended or adjusted under 35 U.S.C. 154(b) by 343 days.

(21) Appl. No.: 17/764,629

(22) PCT Filed: Sep. 28, 2020

(86) PCT No.: PCT/US2020/053167
§ 371 (c)(1),
(2) Date: Mar. 29, 2022

(87) PCT Pub. No.: WO2021/062414
PCT Pub. Date: Apr. 1, 2021

(65) Prior Publication Data
US 2022/0356395 A1 Nov. 10, 2022

Related U.S. Application Data

(60) Provisional application No. 62/907,683, filed on Sep. 29, 2019.

(51) Int. Cl.
*C09K 11/62* (2006.01)
*C01B 21/06* (2006.01)
*H10K 30/35* (2023.01)
*H10K 50/115* (2023.01)

(52) U.S. Cl.
CPC .......... *C09K 11/62* (2013.01); *C01B 21/0602* (2013.01); *H10K 30/35* (2023.02); *H10K 50/115* (2023.02)

(58) Field of Classification Search
None
See application file for complete search history.

(56) References Cited

U.S. PATENT DOCUMENTS

| | | | |
|---|---|---|---|
| 2009/0056628 A1* | 3/2009 | Kortshagen | C30B 7/005 118/718 |
| 2012/0085400 A1* | 4/2012 | Arena | H01L 21/0254 438/93 |
| 2018/0154024 A1* | 6/2018 | Zhu | A61K 49/0067 |
| 2019/0355784 A1* | 11/2019 | Ahmed | H01L 33/0075 |

* cited by examiner

*Primary Examiner* — Jaehwan Oh
(74) *Attorney, Agent, or Firm* — Harness, Dickey & Pierce, PLC

(57) ABSTRACT

A method of making nanoparticles including a semiconducting nitride is provided. The method includes reacting precursors in a gas phase to form the nanoparticles including the semiconducting nitride. The precursors include at least one of a gallium (Ga) precursor or an indium (In) precursor and a nitrogen (N) precursor. The semiconducting nitride is $In_{1-x}Ga_xN$, where $0 \leq x \leq 1$. Structures that include the nanoparticles and systems for making the nanoparticles are also provided.

33 Claims, 22 Drawing Sheets

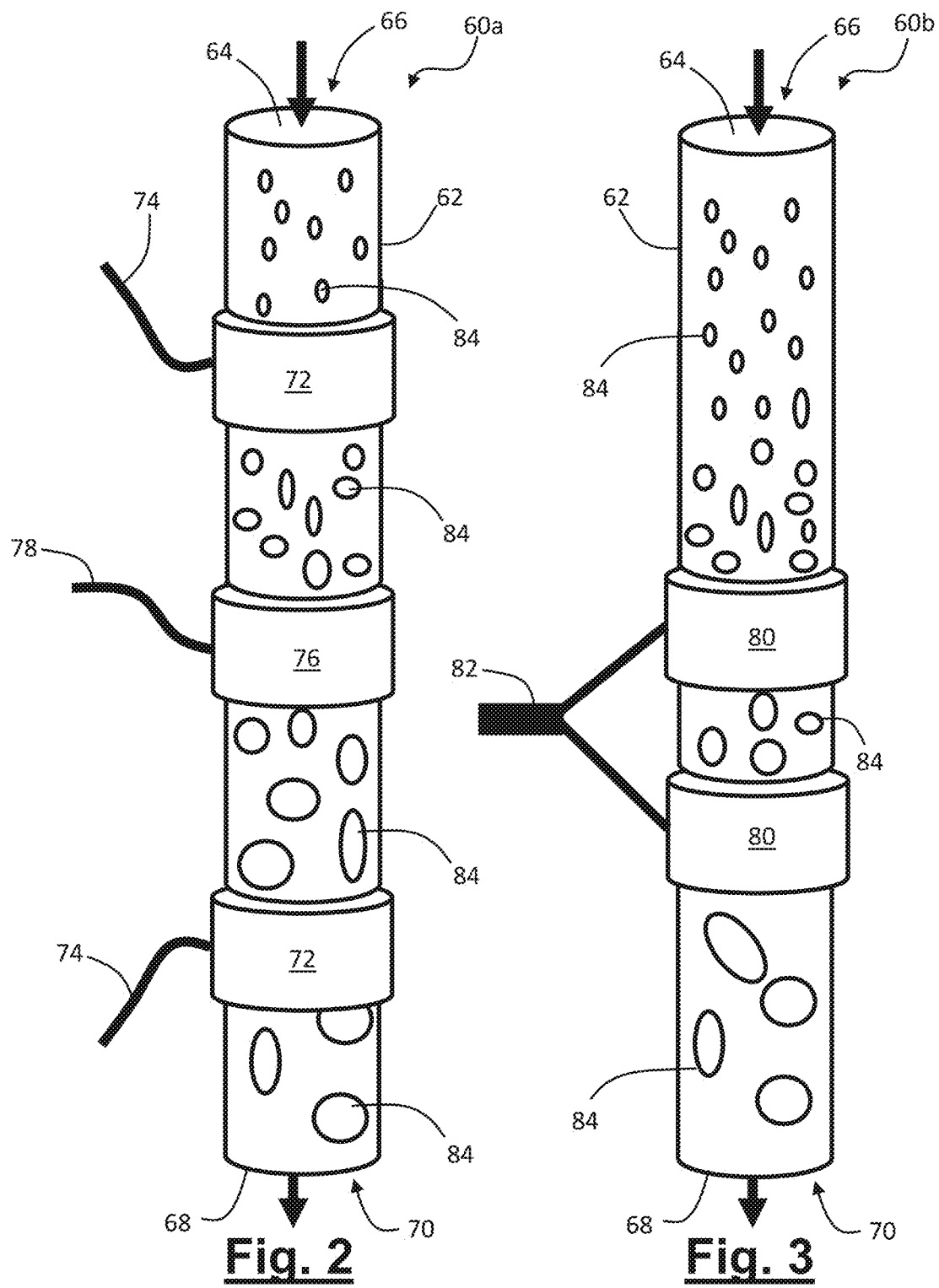

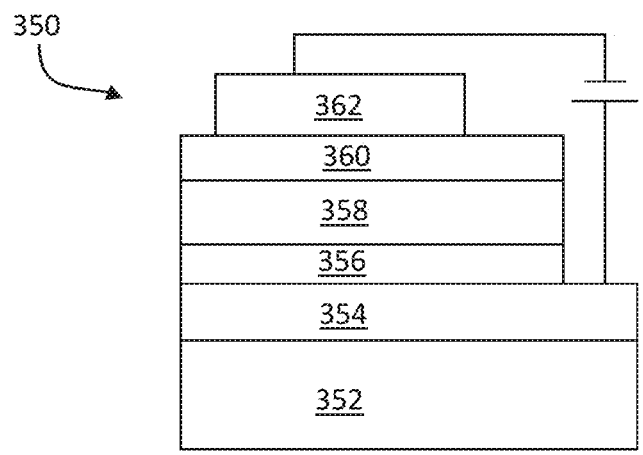
Fig. 19A
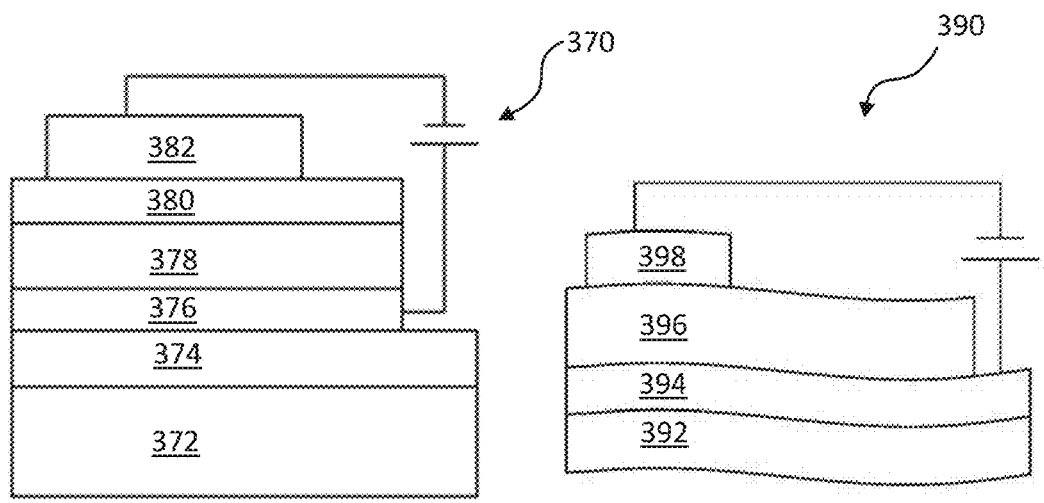
Fig. 19B
Fig. 19C

GALLIUM INDIUM NITRIDE NANOCRYSTALS

CROSS-REFERENCE TO RELATED APPLICATIONS

This application is a 371 U. S. National Phase of International Application No. PCT/US2020/063167, filed Sep. 28, 2020, which claims the benefit of U.S. Provisional Application No. 62/907,683, filed on Sep. 29, 2019. The entire disclosures of the above applications are is incorporated herein by reference.

FIELD

The present disclosure relates to vapor-synthesized nitride nanocrystals for films and electronic devices.

BACKGROUND

This section provides background information related to the present disclosure which is not necessarily prior art.

Gallium nitride (GaN) has garnered much interest for use in light emitting diodes, high power electronics, ultraviolet sensors, and other related technologies. Bulk crystal fabrication for these applications is commonly achieved using epitaxial growth, and competitive device performance relies on excellent crystal quality. This requires a substrate with minimal lattice mismatch in order to avoid the formation of defects during the growth process. Suitable substrates, such as sapphire, tend to be costly and can further limit device performance due to poor electrical or thermal properties. These defects have immense impact on the ability to realize the high-performance power electronics and other benefits promised by GaN and related materials.

The development of freestanding GaN nanocrystals would offer an opportunity to sidestep the above issues by restricting crystal growth to very small domains, over which defects can be limited and/or passivated and substrate issues eliminated. Further, using GaN nanocrystals would open up avenues to novel device manifestations, such as stretchable and flexible architectures. However, to fully exploit these advantages, it is necessary to grow GaN nanocrystals as single freestanding particles. Accordingly, the development of low-cost methods to fabricate GaN nanoparticles (NPs) are desired.

SUMMARY

This section provides a general summary of the disclosure, and is not a comprehensive disclosure of its full scope or all of its features.

In various aspects, the current technology provides a method of making nanoparticles including a semiconducting nitride, the method including reacting precursors in a gas phase to form the nanoparticles including the semiconducting nitride, the precursors including at least one of a gallium (Ga) precursor or an indium (In) precursor, and a nitrogen (N) precursor, wherein the semiconducting nitride is $In_{1-x}Ga_xN$, where $0 \le x \le 1$.

In one aspect, the semiconducting nitride is $In_{1-x}Ga_xN$, where $0 < x < 1$.

In one aspect, the reacting occurs in a plasma.

In one aspect, the plasma is formed within a plasma reactor.

In one aspect, the reacting includes introducing a carrier gas into the plasma reactor, the plasma reactor including a reactor tube and at least one ring electrode that encircles the reactor; introducing the precursors into the reactor; and applying radiofrequency (RF) power to the at least one electrode to cause the plasma to form in the reactor tube.

In one aspect, the Ga precursor includes trimethygallium (TMGa), $GaX_3$ where X is F, Cl, I, Br, or a combination thereof, Ga metal, or a combination thereof; the In precursor includes trimethylindium (TMIn), $InX_3$ where X is F, Cl, I, Br, or a combination thereof, In metal, or a combination thereof; and the N precursor includes ammonia ($NH_3$), $N_2$, or a combination thereof.

In one aspect, the nanoparticles include nanocrystals.

In one aspect, the method includes reacting the Ga precursor, the In precursor, and the N precursor in the plasma reactor.

In one aspect, the nanoparticles are substantially free of ligands.

In one aspect, the method further includes forming a layer on the nanoparticles in a gas phase, wherein the layer defines a nanoparticle shell that has a larger bandgap than the nanoparticles.

In one aspect, the nanoparticle shell includes In-doped GaN, wherein the In-doped GaN has less In than the nanoparticles, GaN, AlN, AlAs, SiC, ZnS, MgS, ZnSe, BeTe, MgTe, MgSe, AlP, GaP, ZnTe, CdSe, CdS, CdTe, InP, $SiO_2$, ZnO, $TiO_2$, SnCl2, $SnI_2$, $SnBr_2$, $PbCl_2$, $PbBr_2$, $PbI_2$, or a combination thereof.

In one aspect, the precursors further include a dopant precursor selected from the group consisting of Ca, Sr, Ba, Si, Ge, Sn, C, Al, Zn, P, Sb, As, and combinations thereof, and wherein the semiconducting nitride includes the dopant at a concentration of greater than 0 to less than or equal to about 10 mol. % based on the total moles of the Ga, In, N, and dopant in the semiconducting nitride nanoparticles In one aspect, the method further includes bonding a ligand to the nanoparticles, wherein the ligand is a passivating ligand, a solubilizing ligand, or a combination thereof.

In one aspect, the method further includes depositing the semiconducting nitride nanoparticles onto a substrate, the substrate including an electrically semiconductive material or an electrically conductive material.

In one aspect, the substrate includes, gold (Au), silver (Ag), copper (Cu), platinum (Pt), tin (Sn), aluminum (Al), iron (Fe) gallium (Ga), indium (In), thallium (Tl), antimony (Sb), bismuth (Bi), titanium (Ti), molybdenum (Mo), niobium (Nb), nickel (Ni), chromium (Cr), magnesium (Mg), silicon (Si), GaN, steel, foils thereof, poly(3,4-ethylenedioxythiophene) polystyrene sulfonate (PEDOT), poly(styrene sulfonate)-doped PEDOT (PEDOT/PSS), ZnO, CdTe, indium tin oxide (ITO), ITO coated glass, $SiO_2$, quartz, glass, sapphire, alumina, polyethylene, polyethylene terephthalate, nylon, polystyerene, polyvinyl chloride, polymethyl methacrylate, polylactic acid, silicone, polydimethylsiloxane (PDMS), and combinations thereof.

In one aspect, the method further includes sintering the layer of the nanoparticles.

In one aspect, the method further includes depositing the nanoparticles onto an electrically insulating substrate.

In one aspect, the method further includes collecting the nanoparticles, combining the nanoparticles in a liquid to form a solution or suspension, casting the solution or suspension on a substrate, and removing at least a portion of the liquid to generate a layer of the nanoparticles on the substrate.

In one aspect, the nanoparticles have an average diameter of greater than or equal to about 0.5 nm to less than or equal to about 1000 nm.

In one aspect, the method further includes incorporating the nanoparticles into a diode, a circuit, a sensor, a rectifier, a photocoupler, a photocatalyst, a catalyst, a photovoltaic cell, a photodetector, a photoconductor, a light emitting diode (LED), a laser, a memory, a transistor, a coating, or a medical coating.

In various aspects, the current technology also provides a structure that includes a substrate, a layer including nanoparticles on the substrate, and an electrode in electrical communication with the layer, wherein the nanoparticles include a semiconducting nitride having the formula $In_{1-x}Ga_xN$, where $0 \leq x \leq 1$.

In one aspect, the nanoparticles are substantially free of ligands.

In one aspect, the layer is in direct contact with the substrate.

In one aspect, the structure further includes an intermediate layer disposed between the substrate and the layer.

In one aspect, the substrate is electrically insulating.

In one aspect, the substrate is electrically semiconductive or electrically conductive.

In one aspect, the structure is a part of a diode, a circuit, a sensor, a rectifier, a photocoupler, a photocatalyst, a catalyst, a photovoltaic cell, a photodetector, a photoconductor, a light emitting diode (LED), a laser, a memory, a transistor, a coating, or a medical coating.

In one aspect, the structure is a part of a light emitting diode (LED) that emits light having a wavelength greater than or equal to about 150 nm to less than or equal to about 2000 nm.

The current technology yet further provides a system including a carrier gas, a nitrogen precursor, at least one of a gallium precursor or an indium precursor, a reactor configured to generate a plasma, and conduits for transporting the carrier gas, the nitrogen precursor, and the at least one of the gallium precursor or the indium precursor to the reactor.

In one aspect, the carrier gas carries the at least one of the gallium precursor or the indium precursor through the conduits.

In one aspect, the system is configured to generate nanoparticles including $In_{1-x}Ga_xN$, where $0 \leq x \leq 1$.

In one aspect, the system is configured to generate nanoparticles including $In_{1-x}Ga_xN$, where $0 < x < 1$.

In one aspect, the system further includes a nitrogen precursor, and at least one of a gallium precursor or an indium precursor, wherein the system is configured to form a semiconducting nitride from the nitrogen precursor, and the at least one of the gallium precursor or the indium precursor in the reactor.

In one aspect, the system further includes a deposition chamber including a translatable substrate, wherein the system is configured so that nanocrystals formed in the reactor are directly deposited onto the substrate from a gas phase.

In one aspect, the carrier gas is the nitrogen precursor.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 2 is a schematic illustration of a first reactor in accordance with various aspects of the current technology.

FIG. 3 is a schematic illustration of a second reactor in accordance with various aspects of the current technology.

FIGS. 19A-19C show exemplary device architectures. FIG. 19A is an exemplary hybrid nitride NC/organic LED and FIG. 19B shows an exemplary NC-based PV. FIG. 19C shows an exemplary flexible NC-only LED/PV architecture.

Figure 20:
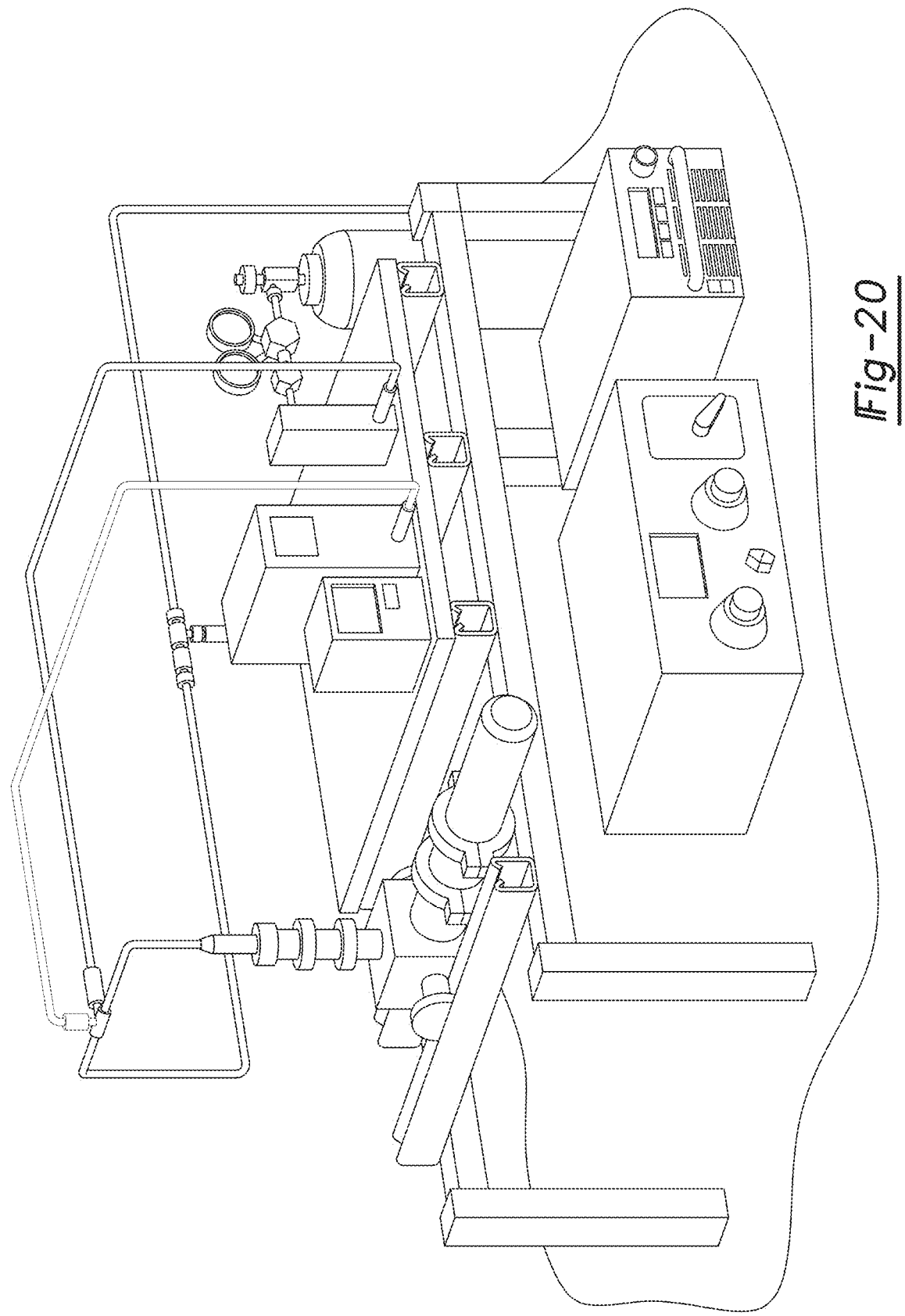

FIG. 20 is a photograph showing a model of a plasma reactor used for InN, GaN, and InGaN NP synthesis in accordance with various aspects of the current technology.

Figure 21A:
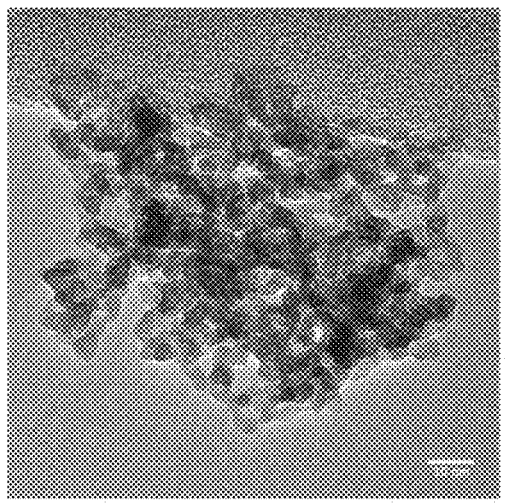
Figure 21B:
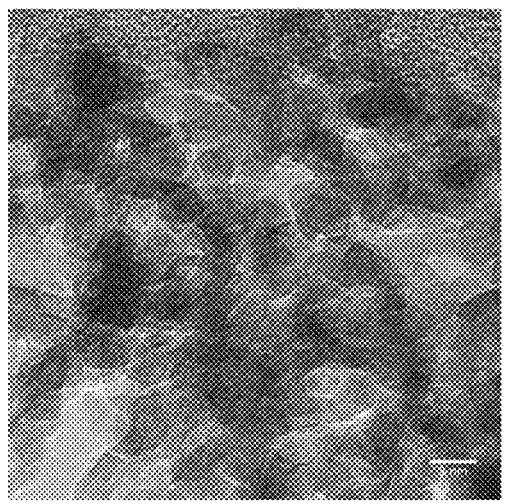
Figure 21C:
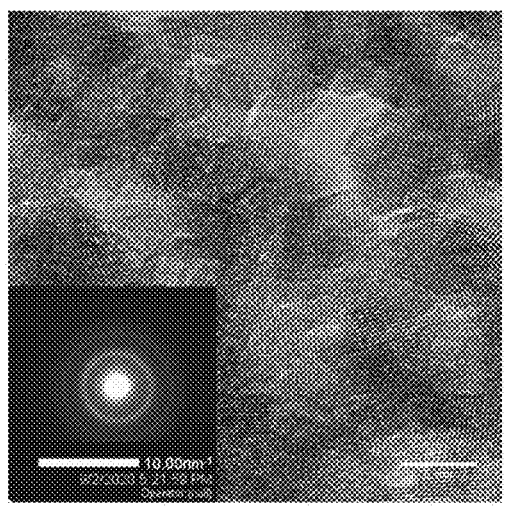

FIG. 21A-21C are TEM images showing InN NPs at different magnifications. The inset on 21C is a representative selected-area electron diffraction (SAED) pattern from the InN NPs. Live Fast Fourier Transform processing of the images indicates a measured interplanar lattice spacing of d=0.24 nm ($\sigma$=0.027 nm) with the closest direction (hkl) for InN being (011) with a calculated spacing of 0.269 nm.

Figure 22:
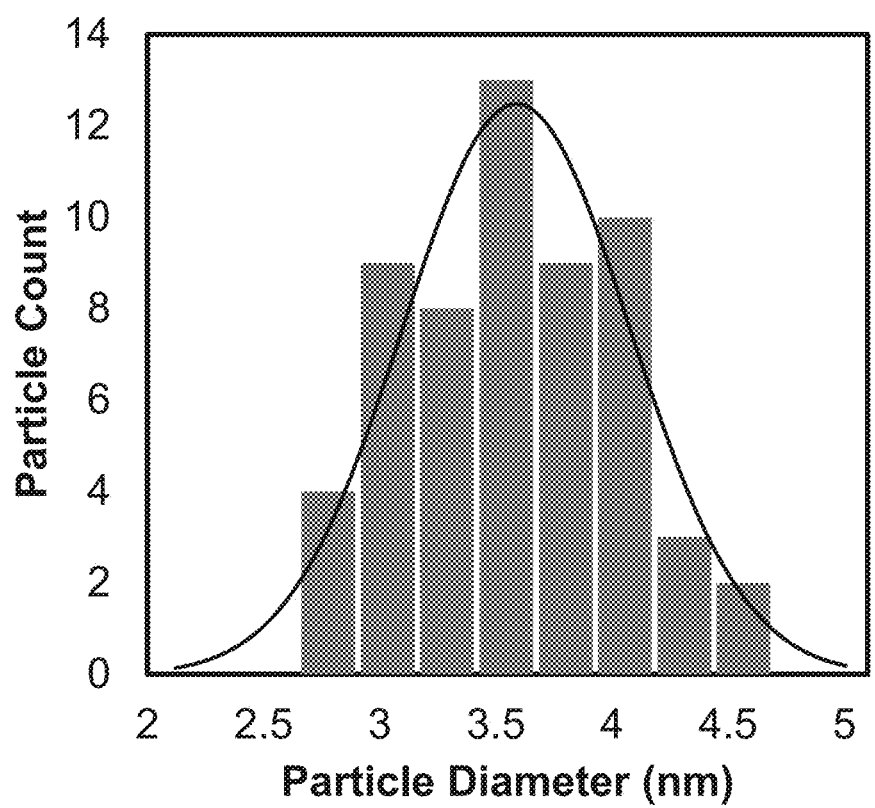

FIG. 22 is a graph showing the InN NP size distribution as measured from TEM image particle counting. The average diameter calculated from this analysis is 3.6 nm ($\sigma$=0.5 nm).

Figure 23:
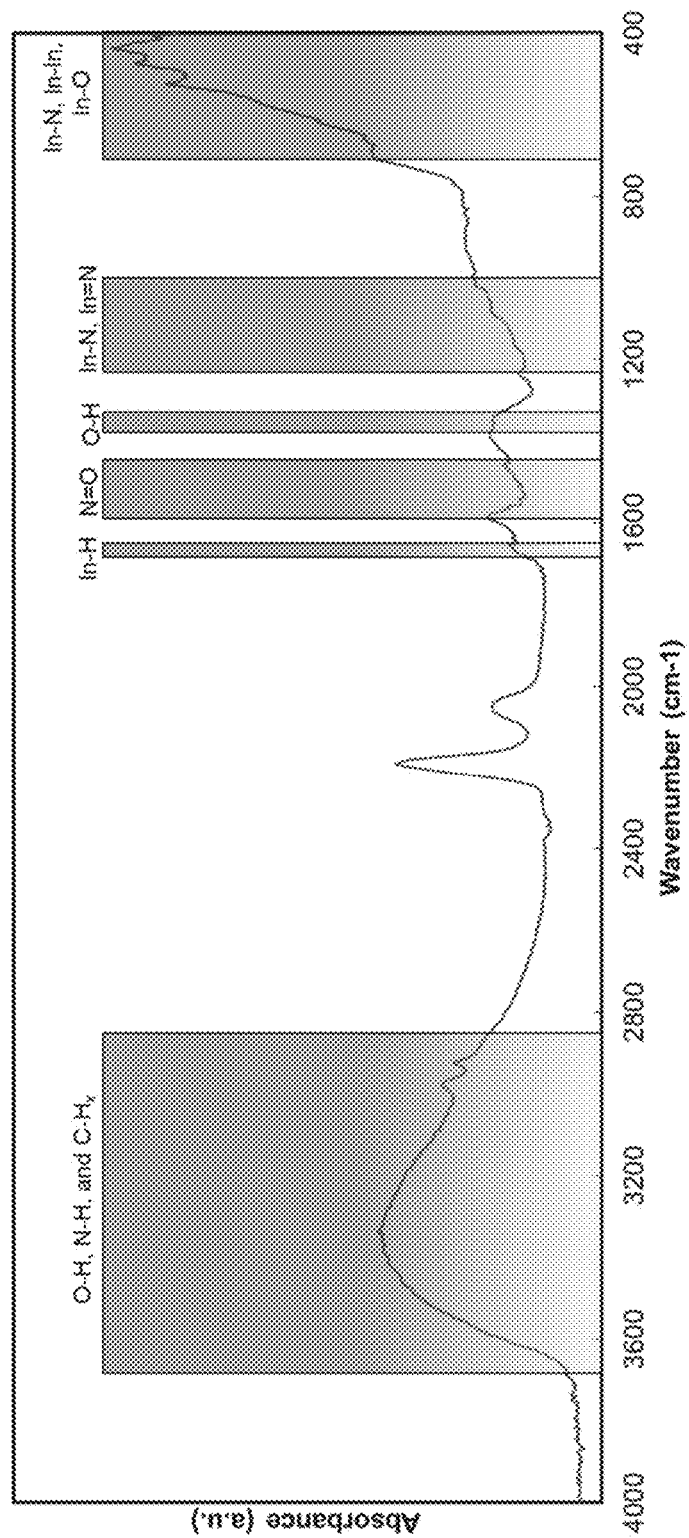

FIG. 23 is a graph showing a representative Fourier transform infrared (FTIR) spectrum from the InN NPs, with absorption peaks identified according to In—N, In—O, N—H, and O—H, and other relevant surface species.

Figure 24A:
Figure 24B:

FIGS. 24A-24B are a photographs of InN NPs deposited on a stainless steel mesh filter in room light (FIG. 24A), visible as an orange powder, and illuminated with a blue-UV flashlight (FIG. 24B). Red emission from the smallest InN Nps is seen around the circled edge.

Corresponding reference numerals indicate corresponding parts throughout the several views of the drawings.

DETAILED DESCRIPTION

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Spatially or temporally relative terms, such as "before," "after," "inner," "outer," "beneath," "below," "lower," "above," "upper," and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

In addition, disclosure of ranges includes disclosure of all values and further divided ranges within the entire range, including endpoints and sub-ranges given for the ranges. As referred to herein, ranges are, unless specified otherwise, inclusive of endpoints and include disclosure of all distinct values and further divided ranges within the entire range. Thus, for example, a range of "from greater than or equal to A to less than or equal to B" or "from greater than or equal to about A to less than or equal about B" is inclusive of A and B.

Example embodiments will now be described more fully with reference to the accompanying drawings.

Gallium nitride (GaN) and indium nitride (InN) are among the most promising and successful single-crystalline materials for LED applications. Thus, the development of low-cost fabrication of these nitrides in nanocrystal (NC) form is provided. The combination of these materials as an alloy ($In_{1-x}Ga_xN$, where $0 \leq x \leq 1$) provides a massive bandgap range from the ultraviolet (UV) for GaN all the way through the spectrum to the deep infrared (IR) for InN, which is further expanded by the potential for quantum confinement. The use of NCs additionally provides for intermixing, extreme UV and tailored VIS/NIR emission for medical applications and lighting, and novel device architectures with altered spin dynamics, which are all attributes that are challenging to achieve using traditional bulk materials. Accordingly, the current technology provides plasma-based synthesis and deposition methods, using flow-through plasmas to controllably create freestanding GaN, InN, and GaInN directly from a gas-phase without substrate influence, to fabricate new manifestations of photovoltaics (PVs), active matrix light emitting diodes (LEDs), and other electronic devices. These methods overcome the broader barriers to fabricating devices with NCs from solution due to difficulties in composition control, limited thermal range to generate high quality crystals, and concerns for solvent orthogonality. The Ga—In—N quantum dot technologies provided herein also enable a move towards sustainable processing and material choice beyond what is available via the currently available organic and inorganic alternatives.

Accordingly, the current technology provides a method of making nanoparticles (NPs) or nanocrystals, also referred to as "quantum dots," comprising a semiconducting nitride, wherein the semiconducting nitride is $In_{1-x}Ga_xN$, where $0 \leq x \leq 1$, which may optionally be further doped. Therefore, the NPs can include InN, GaN, In-doped GaN, doped variants thereof, or a combination thereof. The method include reacting precursors, i.e., reactants, in a gas phase to form the nanoparticles The method is further described with reference to a system for synthesizing nanoparticles 10 shown in FIG. 1. The system 10 includes a carrier gas vessel or container 12 containing a carrier gas, a nitrogen precursor vessel or container 14 containing a nitrogen precursor, a gallium precursor vessel or container 16 containing gallium, and an indium precursor vessel or container 18 containing an indium precursor. The method comprises reacting the Gallium precursor, the indium precursor, or both the gallium and indium precursors with the nitrogen precursor. Therefore, the precursors comprise a Ga precursor and a N precursor, an In precursor and a N precursor, or a Ga precursor, an In precursor, and a N precursor. Non-limiting examples of the Ga precursor include trimethygallium (TMGa), $GaX_3$ (where X is F, Cl, I, or Br), Ga metal, and a combination thereof. Non-limiting examples of the In precursor include trimethylindium (TMIn), $InX_3$ (where X=F, Cl, I, or Br), In metal, and a combination thereof. Non-limiting examples of the N precursor include ammonia ($NH_3$), $N_2$, and a combination thereof. The carrier gas is either inert or a non-reactant, such as helium (He), neon (Ne), argon (Ar), krypton (Kr), xenon (Xe), oxygen ($O_2$), and a combination thereof as non-limiting examples, or the carrier gas can be a precursor or reactant, e.g., a nitrogen precursor gas, such as nitrogen ($N_2$), ammonia ($NH_3$), and a combination thereof, as non-limiting examples.

In some aspects, the In component of $In_{1-x}Ga_xN$ is a dopant, such that $In_{1-x}Ga_xN$ may be described as "indium-doped gallium nitride." However, the GaN or $In_{1-x}Ga_xN$ may be further doped. When further doped, the system 10 further comprises at least one optional dopant precursor vessel or container 20 containing a dopant precursor. The dopant can be any element that is capable of forming a nitride. Non-limiting examples of such dopants include Li, Be, Ba, Mg, Ca, Si, O Sr, B, Al, Cr, W, Mo, V, Ti, Nb, Ta, Zr, P, Cd, Zn, Tl, Sc, Ge, Sn, C, Sb, As, and a combination thereof. By doping, for example, p-doped NPs (e.g., with Mg) or n-doped NPs (e.g., with Si) may be generated. Therefore, the resulting semiconducting nitride has a dopant (non-In dopant) concentration of greater than or equal to 0 mol. % to less than or equal to about 10 mol. % based on the total moles of Ga, In, N, and dopant in the nanoparticles. Precursors for the doping elements are known in the art. As non-limiting examples, SiH4 is a Si dopant precursor, bis (cyclopentadienyl)magnesium(II) is a Mg dopant precursor, and AlN is an Al dopant precursor.

The system 10 also includes a plurality of conduits for transporting the carrier gas and the precursors to a reactor 60. More particularly, the system 10 includes a carrier gas conduit 22, a nitrogen precursor conduit 24, a gallium precursor conduit 26, and an indium precursor conduit 28 for transporting the carrier gas, nitrogen precursor, gallium precursor, and indium precursor, respectively, to the reactor 60. When the additional dopant is present, the system 10 also includes a dopant conduit 30 for transporting the dopant precursor to the reactor 60. Accordingly, the conduits 22, 24, 26, 28, 30 provide directional and fluid communication between the vessels 12, 14, 16, 18, 20 and the reactor 60. In some variations, at least one of the conduits 22, 24, 26, 28, 30 may be a heated conduit or a heated supply line, such as to prevent, inhibit, or minimize condensation (to liquid) at about room temperature. In some aspects, the nitrogen precursor conduit 24 is the carrier gas conduit 22, for example, when the carrier gas is the nitrogen precursor. The below description generally describes the use of a carrier gas and a nitrogen precursor. However, it is understood that the carrier gas and the nitrogen precursor are the same and the system 10 is adjusted accordingly, as would be understood by one having ordinary skill in the art in view of the currently described technology.

The nitrogen precursor, when a gas, may be carried by the nitrogen precursor conduit 24 to a first mass flow meter 32 and then to the reactor 60. The carrier gas is transported by a first branch 22a of the carrier gas conduit 22 to a second mass flow meter 34 in fluid communication with the gallium precursor conduit 26, and a third mass flow meter 36 in fluid communication with the indium precursor conduit 28. When the additional dopant is present, the system 10 also includes at least a fourth mass flow meter 38 in fluid communication with the dopant precursor conduit 30. The carrier gas picks up, i.e., carries, the gallium precursor, the indium precursor, and the optional dopant precursor at the respective mass flow meters 34, 36, 38 and carries the respective precursors through the corresponding precursor conduits 26, 28, 30. The amount of precursors is adjustable at the mass flow meters 32, 34, 36, 38. Moreover, the flow meters 32, 34, 36, 38 can be set to preclude flow of a desired precursor.

Figure 1:
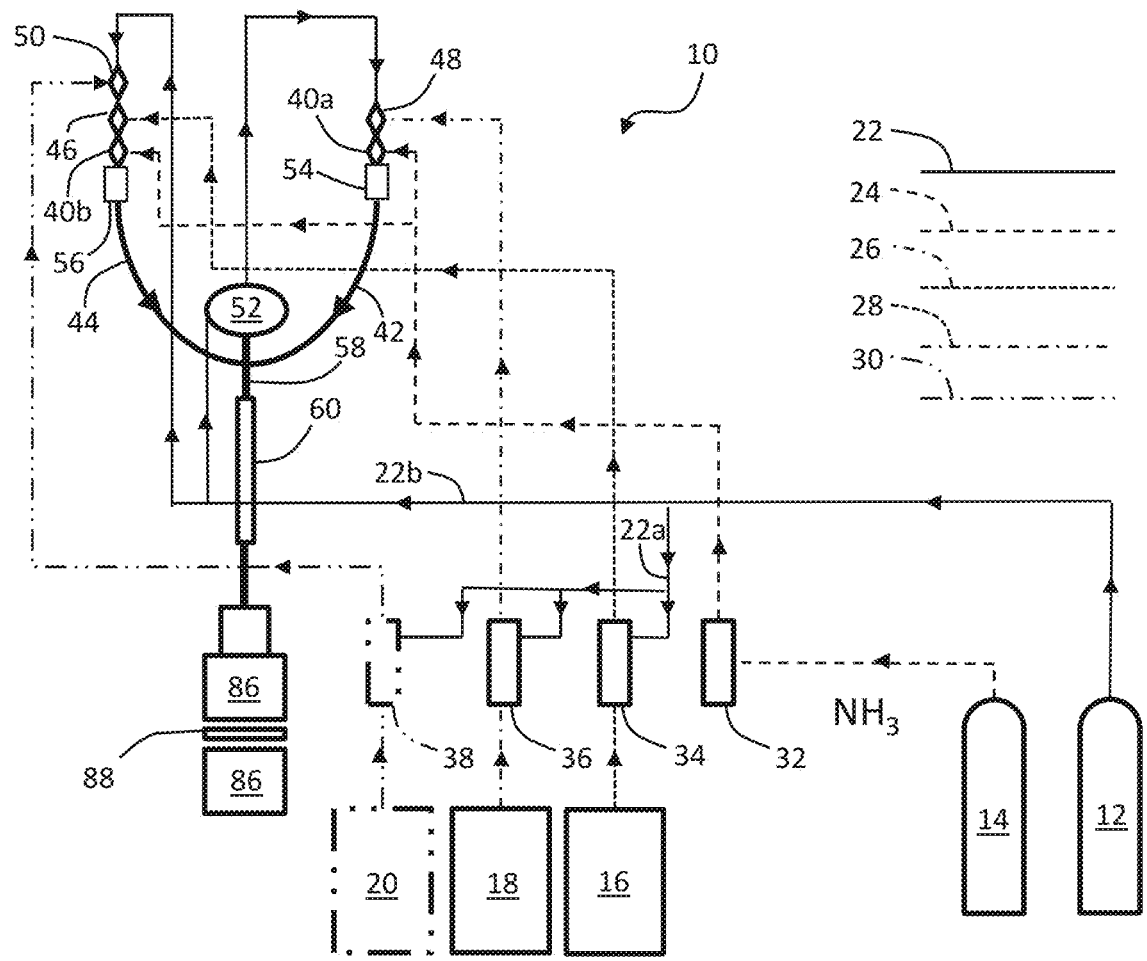
FIG. 1 is a schematic illustration of a system in accordance with various aspects of the current technology.

The nitrogen, gallium, indium, and optional dopant precursors can individually be provided as gases, liquids, or solids. When a gas, the precursor gas mixes with, and is carried, by the carrier gas or the precursor gas can be directly carried to the reactor 60 independent of the carrier gas. When a liquid, the carrier gas is bubbled through the precursor liquid, where the liquid precursor mixes with, and is carried by, the carrier gas as a gas phase. When a solid, the solid precursor is sublimed into the carrier gas. As shown in the figure, the nitrogen precursor is a gas that is directly transported to the reactor 60 by the nitrogen precursor conduit 24, and the gallium and indium precursors are carried by the carrier gas in their respective conduits after 26, 28 the carrier gas is bubbled through them. However, it is understood that the system 10 may be adjusted when the precursors are initially in a different phase. For example, when the nitrogen precursor is a liquid, the carrier gas is bubbled through the nitrogen precursor liquid and carried to the reactor 60 by way of the nitrogen precursor conduit 24. Similarly, if the gallium, indium, and/or optional dopant precursors are gases, they may be directly transported to the reactor 60 in their respective conduits 26, 28, 30, without being carried by the carrier gas. Although the FIG. 1 shows an exemplary configuration for the system 10, the system may be modified depending on the phase of the individual precursors.

Within the nitrogen precursor conduit 24, the carrier gas carries the nitrogen precursor to a first nitrogen coupler 40a upstream of a first intermediate supply conduit 42 and to a second nitrogen coupler 40b upstream of a second intermediate supply conduit 44. Within the gallium precursor conduit 26, the carrier gas carries the gallium precursor to a gallium coupler 46 that is in fluid communication with the second nitrogen coupler 40b. Within the indium precursor conduit 28, the carrier gas carries the gallium precursor to a indium coupler 48 that is in fluid communication with the first nitrogen coupler 40a. Within the dopant precursor conduit 30, the carrier gas carries the dopant precursor (when present) to a dopant coupler 50 that is in fluid communication with the first nitrogen coupler 40a or the second nitrogen coupler 40b, although only shown in fluid communication with the second nitrogen coupler 40b in the figure.

With monitoring of an optional pressure gauge 52, a second branch 22b of the carrier gas conduit 22 transports the carrier gas to the couplers 40a, 48 upstream of the first intermediate supply conduit 42 and to the couplers 40b, 46, 50 upstream of the second intermediate supply conduit 44. A first mixing chamber 54 is down stream of, and in fluid communication with, the first nitrogen coupler 40a and the indium coupler 48. The nitrogen precursor and the indium precursor are combined and mixed together in the first mixing chamber 54. A second mixing chamber 56 is down stream of, and in fluid communication with, the second nitrogen coupler 40b and the gallium coupler 46, and the optional dopant coupler 50. The nitrogen precursor, the gallium precursor, and the optional dopant precursor are combined and mixed together in the second mixing chamber 56.

It is understood that, depending on the desired composition of resulting nanoparticles, the arrangement of the couplers 40a, 48, 40b, 46, and 50 can be altered, such that it may not be necessary to have two intermediate supply conduits 42, 44. Moreover, depending on the desired composition of the resulting nanoparticles, at least one of the second, third, and fourth mass flow meters 34, 36, 38 may not be operated so that at least one of the gallium, indium, or optional dopant precursor is not carried to an intermediate supply conduit 42, 44, with the proviso that at least one of indium precursor or the gallium precursor is carried to an intermediate supply conduit.

The carrier gas carriers the precursors through the intermediate supply conduits 42, 44 to a supply conduit 58 in which all of the precursors are combined and mixed, such as in a union flange. The carrier gas then carriers the precursors thought the supply conduit 58 to the reactor 60. Accordingly, the method comprises carrying the nitrogen precursor, at least one of the gallium precursor or the indium precursor, and optionally a dopant precursor, with the carrier gas to the reactor 60, and reacting the precursors in the gas phase in plasma generated within the reactor 60 to generate nanoparticles.

In certain aspects, the reactor 60 is a first plasma reactor 60a shown in FIG. 2. The first plasma reactor 60a includes a reactor tube 62 that extends from an inlet 64 at a first end 66 to an outlet 68 at an opposing second end 70. The reactor tube comprises a glass, such as a borosilicate glass as a non-limiting example. The carrier gas carrying the precursors is introduced to the first plasma reactor 60a by way of the inlet 64 and in the direction of the top block arrow. Two ground ring electrodes 72 are disposed around the reactor tube 62 and are grounded by way of grounding wires 74. A power-supplying ring electrode 76 is disposed between the two ground ring electrodes 72 and around the reactor tube 62. The power-supplying ring electrode 76 is coupled to a power supply and a matching network by way of a power wire 78. The power-supplying ring electrode 76 supply the reactor 60a with radiofrequency (RF) power. Upon operation of the power supply and the matching network, a plasma is generated within the reactor tube 62.

In certain other aspects, the reactor 60 is a second plasma reactor 60b shown in FIG. 3. The second plasma reactor 60b includes the reactor tube 62 that extends from the inlet 64 at the first end 66 to the outlet 68 at the opposing second end 70. The carrier gas carrying the precursors is introduced to the second plasma reactor 60b by way of the inlet 64 and in the direction of the top block arrow. Differing from the first plasma reactor 60a, the second plasma reactor 60b includes two power-supplying ring electrodes 80 disposed around the reactor tube 62, and no ground ring electrodes The two power-supplying ring electrodes 80 are coupled to the power supply and the matching network, by way of a power wire 82. The power-supplying ring electrodes 80 supply the reactor 60b with RF power. Upon operation of the power supply and the matching network, a plasma is generated within the reactor tube 62.

With reference to FIGS. 1, 2, and 3, the reacting the precursors in the gas phase includes introducing the carrier gas into the plasma reactor 60, 60a, 60b, introducing the precursors into the reactor tube by way of the carrier gas, and applying RF power to the reactor 60, 60a, 60b to cause the plasma to form in the reactor tube 62. Nanoparticles 84 are formed during the reacting in the plasma and increase in size as they travel through the reaction tube in the direction of the block arrows. The nanoparticles exit, i.e., are expelled from, the reactor 60, 60a, 60b at the outlet 68. Controllable parameters of the reactor, 60, 60a, 60b include pressure, tube dimensions, residence time, and gas flowrate, which determine NP size; the input power, which determines the crystallinity of the nanoparticles; and the precursor concentration, which governs both the size of the growing NP and a NP production yield.

The NPs are free or substantially free of ligands. By "substantially free" it is meant that no ligands are provided on the NPs intentionally, i.e., only inadvertent impurities may be included in the NPs, wherein the inadvertent impurities comprise less than or equal to about 5 wt. % of the NPs, less than or equal to about 2 wt. % of the NPs, or less than or equal to about 1 wt. % of the NPs. Also, the nanoparticles an average diameter of greater than or equal to about 0.5 nm to less than or equal to about 1000 nm and/or a bandgap of greater than or equal to about 0.6 eV to less than or equal to about 8 eV.

As shown in FIGS. 1, 2, and 3, the NPs 84 are expelled from the reactor 60, 60a, 60b and transferred to a deposition chamber 86 associated with a vacuum pump (not shown), which is also associated with the reactor 60, where they are deposited onto a substrate 88, which is positioned below the outlet 68 of the reactor 60, 60a, 60b, and which is laterally moveable in two dimensions by a pushrod. Accordingly, the method includes depositing the NPs onto the substrate 88.

In various embodiments, the substrate 88 includes an electrically conductive material or an electrically semiconductive material. Non-limiting examples of electrically conductive materials and electrically semiconductive materials include gold (Au), silver (Ag), copper (Cu), platinum (Pt), tin (Sn), aluminum (Al), iron (Fe) gallium (Ga), indium (In), thallium (Tl), antimony (Sb), bismuth (Bi), titanium (Ti), molybdenum (Mo), niobium (Nb), nickel (Ni), chromium (Cr), magnesium (Mg), silicon, (Si), GaN, steel, foils thereof, poly(3,4-ethylenedioxythiophene) polystyrene sulfonate (PEDOT), poly(styrene sulfonate)-doped PEDOT (PEDOT/PSS), ZnO, CdTe, indium tin oxide (ITO), ITO-coated glass, and combinations thereof.

In other embodiments, the substrate 88 comprises an electrically insulating material. Non-limiting examples of electrically insulating materials include $SiO_2$, quartz, alumina, plastic (polyethylene, polyethylene terephthalate, nylon, polystyerene, polyvinyl chloride, polymethyl methacrylate, polylactic acid, silicone, polydimethylsiloxane (PDMS)), sapphire, glass, and combinations thereof.

In other embodiments, the substrate 88 is a transport layer comprising ZnO, $TiO_2$, $MoO_3$, N,N'-Bis(naphthalen-1-yl)-N,N'-bis(phenyl)benzidine, fullerenes (e.g., $C_{60}$, $C_{70}$, and $C_{84}$), phenyl-$C_{61}$-butyric-acid-methyl-ester (PCBM), non-fullerene acceptors, N,N'-Bis(naphthalen-1-yl)-N,N'-bis(phenyl)-2,7-diamino-9,9-spirobifluorene, N,N'-Bis(3-methylphenyl)-N,N'-bis(phenyl)-benzidine, PFN-B-diiodine salt, 1,3,5-Tris(1-phenyl-1Hbenzimidazol-2-yl)benzene, 8-Hydroxyquinolinolato-lithium, Rubidium carbonate, Rhenium(VI) oxide, 4,4',4"-Tris(N-3-methylphenyl-N-phenyl-amino)triphenylamine, nanotubes, conductive nanoparticles (e.g., TIO), or a combination thereof, as non-limiting examples.

The depositing the NPs onto the substrate 88 can include depositing a layer comprising the NPs on the substrate 88. In some embodiments, the depositing is performed directly after the reacting by moving the substrate 88 under the second end 70 of the reactor tube 62.

In other aspects, the method includes collecting the NPs, combining the NPs in a liquid to form a solution or suspension, casting the solution or suspension on a substrate, and removing at least a portion of the liquid to generate a layer of the nanoparticles on the substrate. However it is formed, the method can also include sintering the layer comprising the NPs. Sintering densifies the layer comprising the NPs and decreases the porosity of the layer comprising the NPs.

In various embodiments, the method further includes forming a layer or a shell on the NPs, wherein the layer or shell includes secondary NPs that have a larger bandgap than the NPs, which define NP cores that are coated by the layer or shell. Therefore, the layer or shell defines a nanoparticle shell having the larger bandgap. The forming of the layer or shell can also be performed in a gas phase. The layer or shell covers at least a portion of the NPs and includes InGaN with lower In content than the NPs, GaN, AlN, AlAs, SiC, ZnS, MgS, ZnSe, BeTe, MgTe, MgSe, AlP, GaP, ZnTe, CdSe, CdS, CdTe, InP, $SiO_2$, ZnO, $TiO_2$, $SnCl_2$, $SnI_2$, $SnBr_2$, $PbCl_2$, $PbBr_2$, $PbI_2$, and combinations thereof, as non-limiting examples.

In various embodiments, the method further includes bonding a ligand to the NPs. The ligand is a passivating ligand, a solubilizing ligand, or a combination thereof. Passivating ligands passive defects on NP surfaces. Solubilizing ligands increase the solubility of the NPs. As non-limiting examples, the ligand comprises 1,2-ethanedithiol (EDT), 1,2-benzenedithiol (1,2-BDT), 1,3-benzenedithiol (1,3-BDT), 1,4-benzenedithiol, 3-mercaptopropionic acid, ethylenediamine, ammonium thiocyanate, tetrabutylammonium fluoride, tetrabutylammonium chloride, tetrabutylammonium bromide, tetrabutylammonium iodide, oleylamine, dodecylamine, carboxylic acid derivatives, and combinations thereof. In certain aspects, the ligand is at least fluoride and/or amine.

In some embodiments, the method further includes incorporating the nanoparticles into a diode, a circuit, a sensor, a rectifier, a photocoupler, a photocatalyst, a catalyst, a photovoltaic cell, a photodetector, a photoconductor, a light emitting diode (LED, which can be flexible and/or stretchable), a laser, a memory, a transistor, a coating, or a medical coating.

The current technology also provides a structure comprising the NPs made by the above method. The structure includes a substrate (as described above), a layer comprising the NPs on the substrate, and an electrode in electrical communication with the layer. The NPs are substantially free of ligands or comprise passivating ligands, solubilizing ligands, or a combination thereof, as described above.

In some embodiments, the layer is in direct contact with the substrate. In other embodiments, the structure comprises an intermediate layer disposed between the substrate and the layer.

Figure 4:
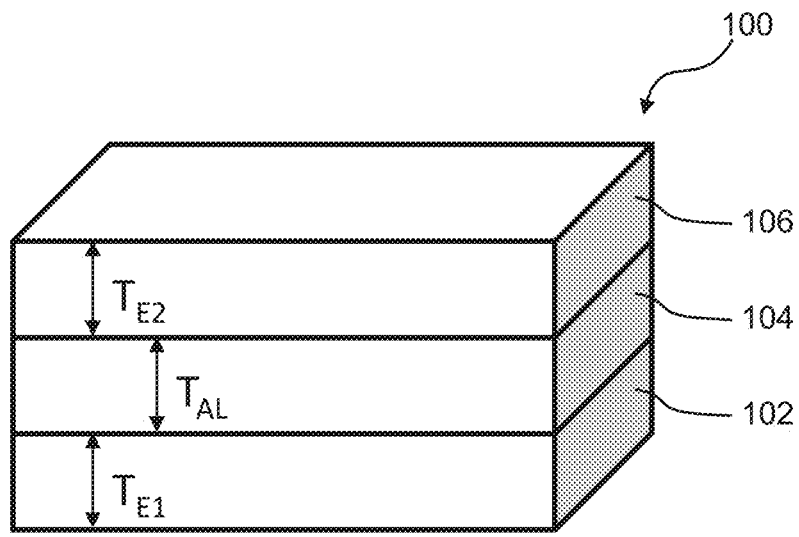
FIG. 4 is a schematic illustration of a first layered structure in accordance with various aspects of the current technology.

Accordingly, the current technology also provides a structure or device that includes the layer including the NPs made by the above method and system. With reference to FIG. 4, the current technology provides a device 100. The device 100 comprises a first electrode 102 having an electrically conductive surface 103, an active layer 104, and a second electrode 106. In some aspects, each of the first electrode 102, the active layer 104, and the second electrode 106 are flexible, such that the device 10 is itself flexible. In other aspects, the device 100 has a low flexibility or is rigid or substantially rigid. The active layer 104 is disposed on the electrically conductive surface 103 of the first electrode 102 such that the active layer 104 is located between the first electrode 102 and the second electrode 106.

The active layer 104 includes the nanoparticles described above. In one aspect, the active layer 104 comprises the nanoparticles. In another embodiment, the active layer 104 consists essentially of the nanoparticles. By "consists essentially of" it is meant that the active layer 104 includes only the nanoparticles; however, the active layer 104 may include impurities that do not detectably affect the activity of the nanoparticles, wherein the impurities are present in the active layer 104 at a concentration of less than or equal to about 10 wt. % of the active layer 104. The active layer 104 comprising the nanoparticles can have a thickness $T_{AL}$ of greater than or equal to about 1 nm to less than or equal to about 50 μm, greater than or equal to about 1 nm to less than or equal to about 20 µm, greater than or equal to about 1 nm to less than or equal to about 10 µm, greater than or equal to about 1 nm to less than or equal to about 2 µm, or greater than or equal to about 1 nm to less than or equal to about 1 µm.

In FIG. 4, the first electrode 102 is a substrate for the formation of the active layer 104. Therefore, the first electrode 102 can be a monolithic substrate that is electrically conductive. The first electrode 102 and the second electrode 106 are independently an anode and a cathode. The first and second electrodes 102, 106 comprise a conducting material individually selected from the group consisting of a conducting oxide, such as indium tin oxide (ITO), aluminum doped zinc oxide (AZO), fluorine doped tin oxide (FTO), indium zinc oxide, InZnAlO (IZAO, e.g., 90 wt. % $In_2O_3$, 5 wt. % ZnO, and 5 wt. % $Al_2O_3$), InAlZnSnO (IZATO), zinc oxide, ZnAlO (ZAO), cadmium oxide, zirconium indium oxide (ZrIO), and gallium zinc oxide (GZO); a metal, such as Al, Au, Ag, Mo, Cu, or Ni, carbon, graphene, graphene oxide, and poly(3,4-ethylenedioxythiophene) polystyrene sulfonate (PEDOT:PSS); and combinations thereof, as non-limiting examples.

The first electrode 102 has a thickness $T_{E1}$ and the second electrode 106 has a thickness $T_{E2}$, wherein thickness $T_{E1}$ and thickness $T_{E2}$ are individually and independently greater than or equal to about 1 nm to less than or equal to about 200 nm, greater than or equal to about 1 nm to less than or equal to about 100 nm, or greater than or equal to about 1 nm to less than or equal to about 75 nm greater than or equal to about 1 nm to less than or equal to about 50 nm, or greater than or equal to about 1 nm to less than or equal to about 20 nm.

Figure 5:
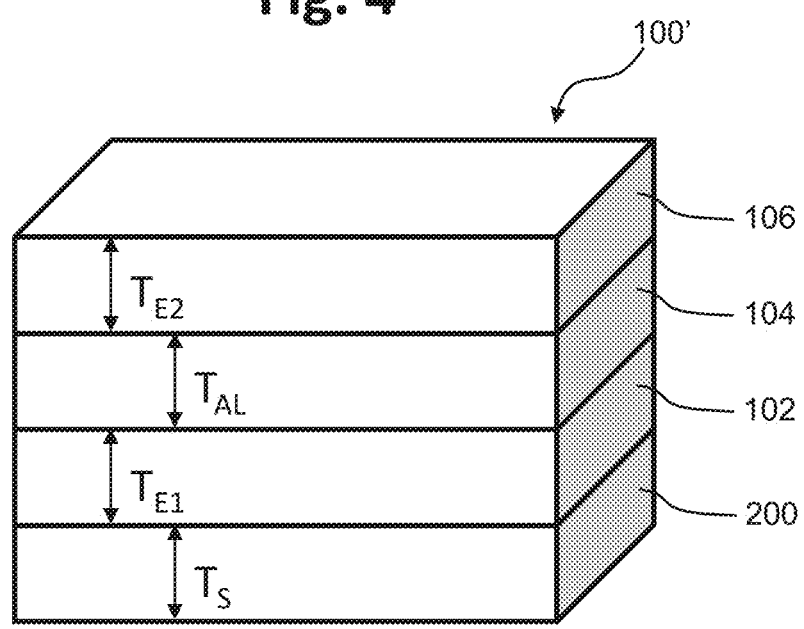
FIG. 5 is a schematic illustration of a second layered structure in accordance with various aspects of the current technology.
Figure 6:
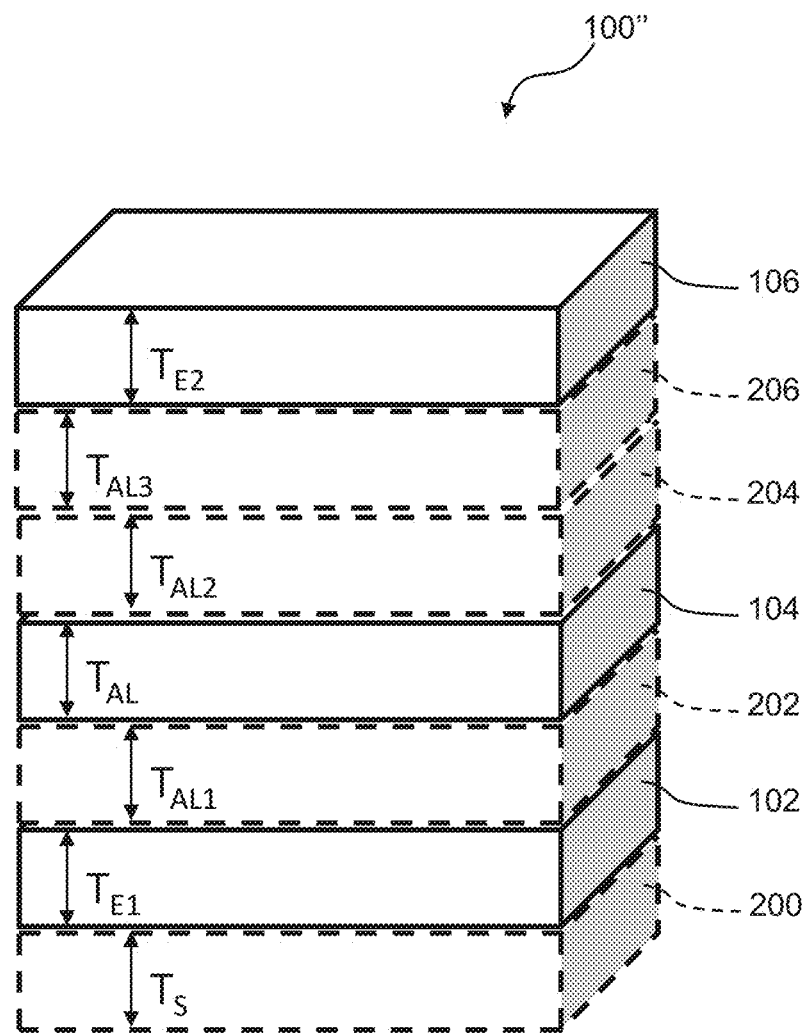
FIG. 6 is a schematic illustration of a third layered structure in accordance with various aspects of the current technology.

In some embodiments, the first electrode 102, rather than being a substrate, is disposed on a substrate. For example, FIG. 5 shows a second device 100', which has the same first electrode 102, active layer 104, and second electrode 106 as the device 10 of FIG. 4. However, the first electrode 102 of the second device 100' is disposed on a substrate 200. Accordingly, in some embodiments, the substrate 200 comprises an electrically non-conductive portion, and the electrically conductive first electrode 102. The substrate 200 can flexible, substantially rigid, or rigid and comprises an electrically non-conductive material, such as glass, low iron glass, plastic, poly(methyl methacrylate) (PMMA), poly-(ethylmethacrylate) (PEMA), (poly)-butyl methacrylate-co-methyl methacrylate (PBMMA), polyethylene terephthalate (PET), polycarbonate, polyimides, such as Kapton® polyimide films (DuPont, Wilmington, DE), and combinations thereof as non-limiting examples. Here, the first electrode 102 is disposed on the substrate 200, and the active layer 104 is disposed on an electrically conductive surface of the first electrode 102. The substrate 200 has a thickness $T_s$ of less than or equal to about 5 mm, less than or equal to about 1 mm, less than or equal to about 500 µm, less than or equal to about 100 µm, less than or equal to about 10 µm, such as from greater than or equal to about 500 µm to less than or equal to about 5 mm FIG. 6 shows a third device 100", which has the same first electrode 1, active layer 1, and second electrode 1 as the photovoltaic device 100 of FIG. 4. The third device 100" optionally includes a substrate 200 as described with reference to FIG. 5. However, the third device 100" further comprises at least one optional adjunct layer. For example, in FIG. 6, the third device 100" is shown with an optional first adjunct layer 202 disposed between the first electrode 102 and the active layer 104, an optional second adjunct layer 204 located between the active layer 104 and the second electrode 106, and an optional third adjunct layer 206 located between the optional second adjunct layer 204 and the second electrode 106. The adjunct layers 202, 204, 206 are flexible, substantially rigid, or rigid and can individually be a hole transport layer, an electron blocking layer, a buffer layer, an electron transport layer, a hole blocking layer, or an electron extraction layer.

In various embodiments, the third photovoltaic device 100" comprises the optional first adjunct layer 202 as a hole transport layer/work function modifying layer/buffer layer/hole selective layer, wherein work function modifying layers are added to get a wetting. Here, the optional first adjunct layer 202 comprises poly(3,4-ethylenedioxythiophene) polystyrene sulfonate (PEDOT:PSS), poly(3-hexylthiophene-2,5-diyl) (P3HT), N,N'-Bis(naphthalen-1-yl)-N,N'-bis(phenyl)-2,2'-dimethylbenzidine (NPD), N,N'-Bis(3-methylphenyl)-N,N'-bis(phenyl)-benzidine (TPD), 2,2',7,7'-Tetrakis(N,N-diphenylamino)-2,7-diamino-9,9-spirobifluorene (spiro-TAD), Poly[N,N'-bis(4-butylphenyl)-N,N'-bis(phenyl)-benzidine] (poly-TPD), CuSCN, CuI, $MoO_3$, NiO, or a combination thereof.

In various embodiments, the third photovoltaic device 100" comprises the optional second adjunct layer 204 as an electron transport layer/electron extraction layer. Here, the optional second adjunct layer 204 comprises a fullerene, such as $C_{60}$, $C_{70}$, $C_{84}$, or phenyl-$C_{61}$-butyric-acid-methyl-ester (PCBM), ZnO, $TiO_2$, NiO, $MoO_3$, nanotubes, conductive nanoparticles (e.g., TIO), or a combination thereof. For example, the role of fullerenes in solar cells is typically to aid in electron extraction, and therefore, layers should be as thin as possible to prevent tail state absorption, e.g., less than or equal to about 40 nm, less than or equal to about 20 nm, less than or equal to about 10 nm, less than or equal to about 5 nm, or less than or equal to about 1 nm.

In various embodiments, the third photovoltaic device 100" comprises the optional third adjunct layer 206 as an electron transport layer/electron extraction layer/buffer layer/hole blocking layer. The optional third adjunct layer 206 provides an ohmic contact between the active layer 104 and the second electrode 106. Here, the optional third adjunct layer 206 comprises [6,6]-phenyl-C61-butyric acid methyl ester (PCBM), Al-doped ZnO (AZO), $TiO_2$, bathocuproine (BCP), $MoO_3$, or a combination thereof, as non-limiting examples.

The optional first adjunct layer 202 has a thickness $T_{AL1}$, the optional second adjunct layer 204 has a thickness $T_{AL2}$, and the optional third adjunct layer 206 has a thickness $T_{AL3}$. $T_{AL1}$, $T_{AL2}$, and $T_{AL3}$ are independently and individually greater than or equal to about 0.5 nm to less than or equal to about 200 nm, greater than or equal to about 1 nm to less than or equal to about 100 nm, or greater than or equal to about 5 nm to less than or equal to about 75 nm.

When the third device 100" comprises an adjunct layer 202, 204, 206 that is an electron transport layer or a hole transport layer, the electrode 102, 106 that is located adjacent to the electron transport layer is the cathode and the electrode 102, 106 that is adjacent to the hole transport layer is the anode.

In various embodiments, the third photovoltaic device 100" comprises at least one adjunct layer 202, 204, 206 selected from the group consisting of a hole transport layer, an electron blocking layer, a buffer layer, an electron transport layer, a hole blocking layer, an electron extraction layer, and combinations thereof, wherein the at least one adjunct layer 202, 204, 206 is disposed between the first electrode 102 and the active layer 104 comprising the nanoparticles, between the second electrode 106 and the active layer 104 comprising the nanoparticles, or between both the first electrode 102 and the active layer 104 comprising the nanoparticles and between the second electrode 106 and the active layer 104 comprising the nanoparticles.

Figure 7:
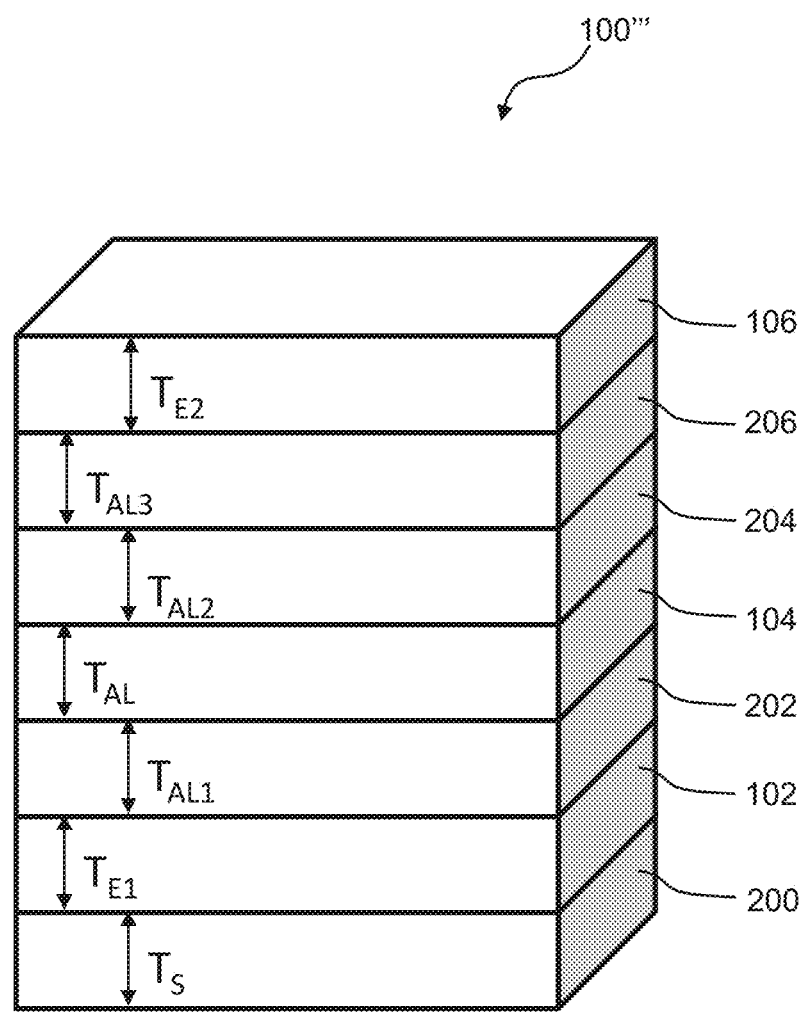
FIG. 7 is a schematic illustration of a fourth layered structure in accordance with various aspects of the current technology.

FIG. 7 shows a fourth device 100'''. The fourth device 100''' comprises every layer described in relation to FIGS. 4-6. In particular, the fourth device 100''' sequentially comprises the substrate 200, the first electrode 102, the first adjunct layer 202, the active layer 104, the second adjunct layer 204, the third adjunct layer 206, and the second electrode 106. Here, the first adjunct layer 202 is a hole transport layer and the second adjunct layer 204 is an electron transport layer. Therefore, the first electrode 102 is an anode and the second electrode 106 is a cathode. It is understood that each of the layers 102, 104, 106, 108, 200, 202, 204, 206 can be flexible, substantially rigid, or rigid. It is also understood that any of the photovoltaic devices 100, 100', 100'', 100''' described herein can further comprise additional active layers and additional adjunct layers.

In various embodiments, the photovoltaic devices of the current technology, including the devices 100, 100', 100'', 100''' of FIGS. 4-7, PVs, and LEDs, are flexible, substantially rigid, or rigid, and are comprised of a plurality of layers, each of which can be visibly transparent, i.e., having an average visible transmittance of greater than or equal to about 75%. Moreover, each of the plurality of layers 102, 104, 106, 108, 200, 202, 204, 206 can be flexible such that the photovoltaic devices have a bend radius of greater than or equal to about 1 mm to less than or equal to about 100 mm, greater than or equal to about 2 mm to less than or equal to about 50 mm, or greater than or equal to about 3 mm to less than or equal to about 10 mm. Further each of the plurality of layers 102, 104, 106, 108, 200, 202, 204, 206 can be stretchable.

The devices of the current technology, including the photovoltaic devices 100, 100', 100'', 100''' of FIGS. 4-7, have a power conversion efficiency (PCE) of greater than or equal to about 1%, greater than or equal to about 5%, greater than or equal to about 6%, greater than or equal to about 6.5%, greater than or equal to about 10%, greater than or equal to about 15%, greater than or equal to about 20%, greater than or equal to about 25%, or greater than or equal to about 30%. The photovoltaic devices also have an external quantum efficiency (EQE) of greater than or equal to about 10%, greater than or equal to about 25%, greater than or equal to about 50%, or greater than or equal to about 75%.

The structures and devices describe herein can be a part of film, a diode, a circuit, a sensor, a rectifier, a photocoupler, a photocatalyst, a catalyst, a photovoltaic cell, a photodetector, a photoconductor, a light emitting diode (LED), a laser, a memory, a transistor, a coating, or a medical coating. When the structure is a part of an LED, the LED emits light having a wavelength greater than or equal to about 150 nm to less than or equal to about 2000 nm. Moreover, the LED or PV can be flexible and/or stretchable.

Embodiments of the present technology are further illustrated through the following non-limiting examples.

Example 1

Group III-nitrides, such as gallium nitride (GaN) and indium nitride (InN), play an important role in electroluminescent devices and power electronics. In pursuit of increased flexibility and reduced cost, there have been many attempts to synthesize these materials in nanocrystal form via a range of methods. Here, the synthesis of GaN nanocrystals using a radiofrequency (RF) nonthermal plasma under low pressure conditions is demonstrated. This method allows for control over both the crystallinity of the nanoparticles, as well as their size. In addition, little change is observed in the surface composition upon exposure to air, as evaluated using Fourier-transform infrared spectroscopy (FTIR). Elemental analysis indicates that nitrogen vacancies (especially near the surface) in the nanoparticles may be the cause of the low luminescence. However, the high quality of the nanocrystals points to the promise of this method for effective Group III-nitride nanoparticle synthesis.

Figure 8A:
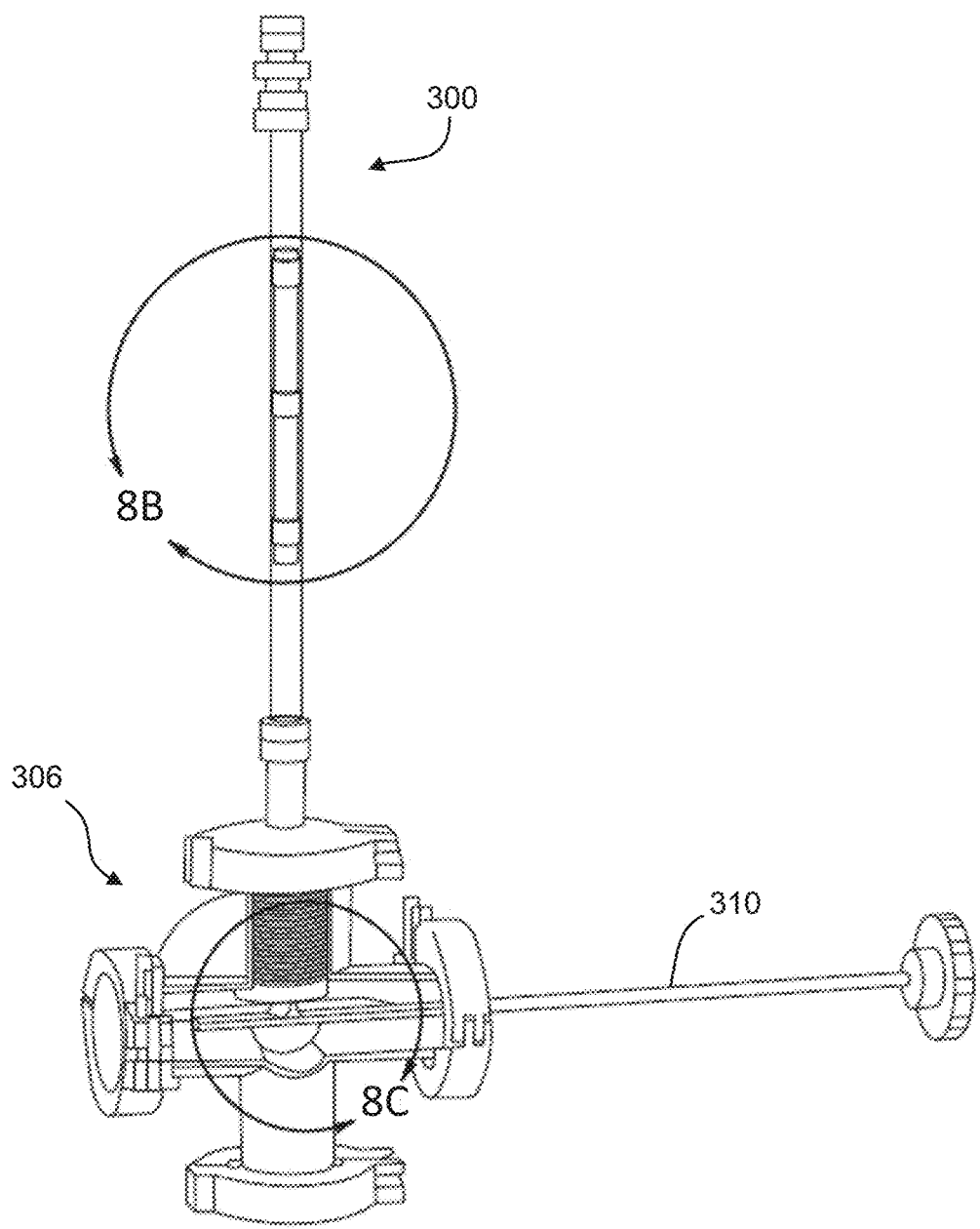
FIG. 8A shows a model of a plasma reactor and deposition chamber used for GaN NP synthesis in accordance with various aspects of the current technology.
Figures 8B, 8C:
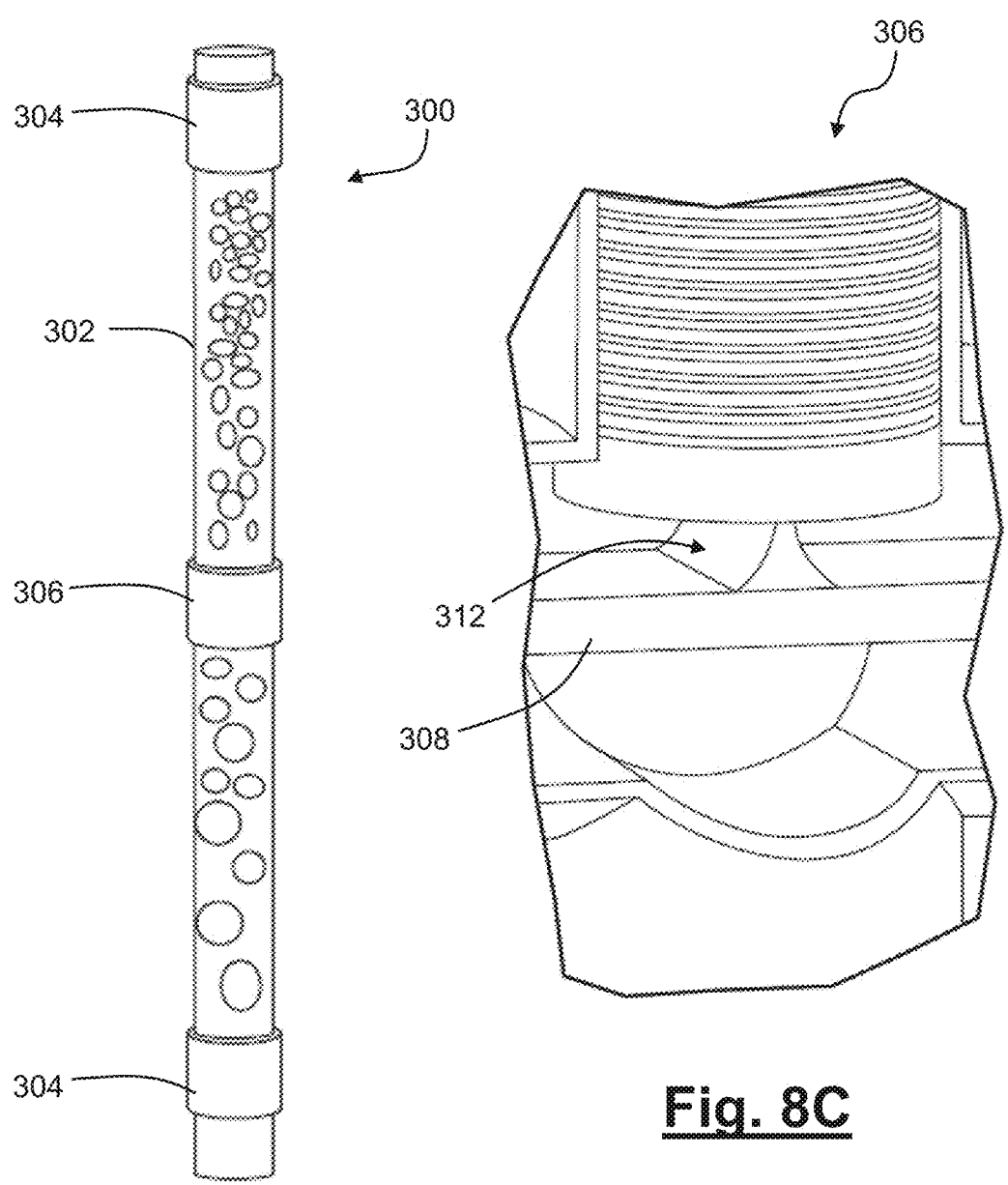
FIG. 8B shows the electrode configuration of FIG. 8A taken about circle 8B and FIG. 8C shows the inertial impaction of NPs onto a substrate placed below the slit-shaped orifice of FIG. 8A taken about circle 8C.

A reactor 300 utilized here is shown in FIGS. 8A-C, which is similar the reactor 60a shown in FIG. 2. The reactor includes a reaction tube 302, and a pair of grounded ring electrodes 304, and a power-supply electrode 306 disposed around the reaction tube 302 between the pair of grounded ring electrodes. A deposition chamber 306 is positioned below the reactor 300 and carries a substrate 308, which is translatable by a pushrod 310. Trimethylgallium (TMGa) and ammonia ($NH_3$) precursors combined with an argon background gas are flown to the reactor 300. The argon flow rate is 60 sccm and the precursor gas flow rates of TMGa and $NH_3$ are 1 and 65 sccm, respectively. Three ring electrodes 304, 306 are placed around the glass reactor tube 302 (0.375" outer diameter and 0.275" inner diameter). The central power-supplying electrode 306 is supplied with power from an RF power supply at 13.56 MHz (T&C AG0313) and a matching network (MFJ-989D) to maximize power delivery, while the upper and lower grounded ring electrodes 304 are grounded. Supplied power is held between 120 and 180 W and the pressure is maintained between 6 and 8 torr. GaN NPs 312 are collected downstream of the reactor via inertial impaction of the NPs onto a substrate directly from the gas phase.

Figure 9:
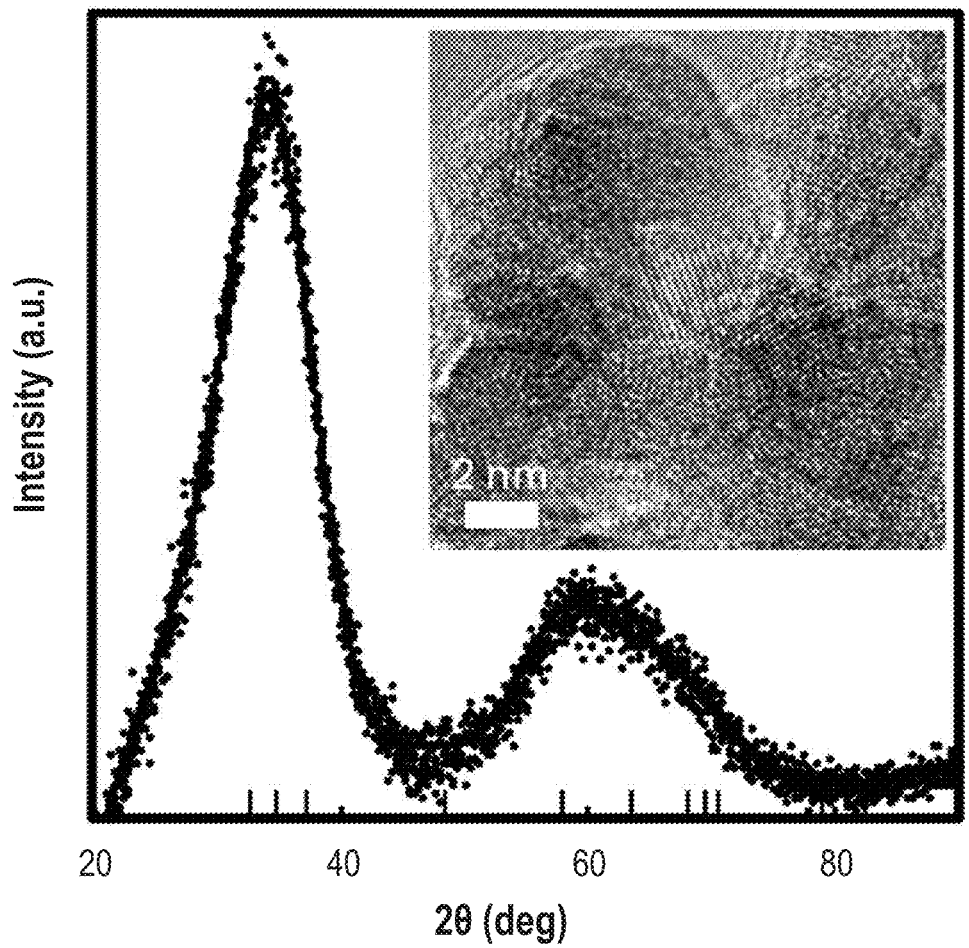
FIG. 9 is graph showing a representative X-ray diffraction (XRD) pattern from the GaN NPs, with peak fitting shown according to a wurtzite crystal structure. The inset shows a sample transmission electron microscopy (TEM) image of the GaN NPs.
Figure 10A:
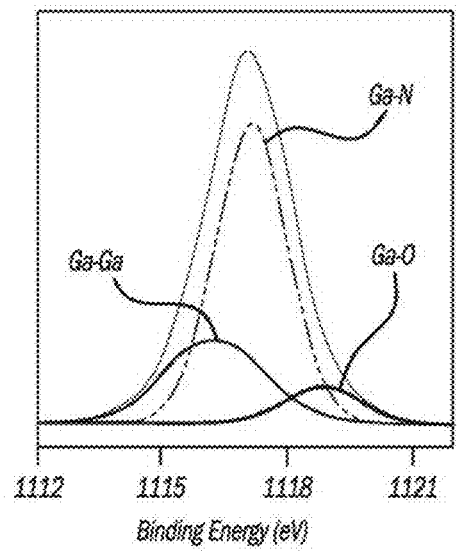
FIGS. 10A-10D shows X-ray photoelectron spectroscopy (XPS) of Ga2p3/2 (FIG. 10A), C1s (FIG. 10B), N1s (FIG. 10C), and O1s (FIG. 10D) peaks. Each peak is an average of three samples with the standard deviation denoted by the shaded region.
Figure 10B:
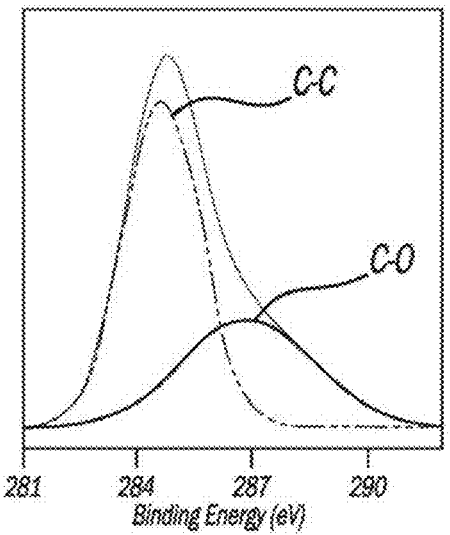
Figure 10C:
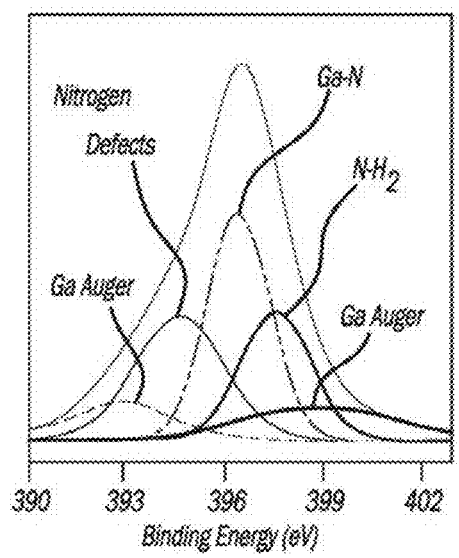
Figure 10D:
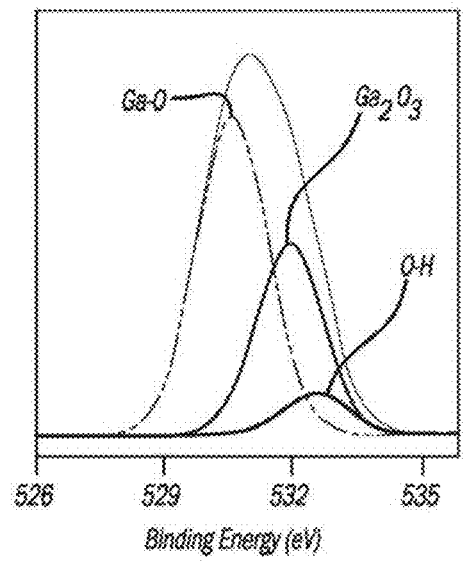

GaN may crystallize in the wurtzite, zinc blende, or rock salt phase, where the wurtzite phase is the stable phase at ambient conditions. The crystal structure of the synthesized GaN NPs is investigated by use of transmission electron microscopy (TEM) and image processing software (Image J). Measurement of the atomic plane spacing indicates the presence of GaN NPs in good agreement with wurtzite crystal phase, with average spacing of 4.5±0.5 angstroms. Further support of crystalline GaN NPs is provided by X-ray diffraction (XRD), shown in FIG. 9. Broadening of the diffraction peaks is present due to the small crystallite size. The XRD pattern is fit sufficiently by Rietveld refinement, using only the wurtzite structure and three free parameters (NP radii), which indicates that if the zinc blende structure is present, it is only present in minute amounts. From this fitting, an ellipsoidal crystallite shape with three characteristic radii of 1.7 nm, 1.7 nm, and 2.9 nm is extracted.

Figure 11:
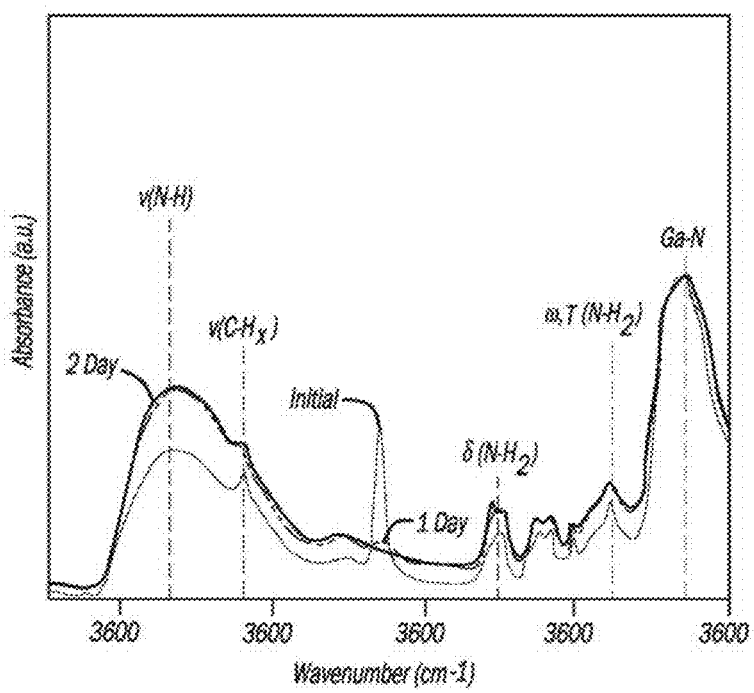
FIG. 11 shows Fourier-transform infrared spectroscopy (FTIR) spectra from the GaN NPs, measured immediately after synthesis (initial) and following one and two days of ambient exposure. The Ga- and N-related peaks appear largely unchanged by aging.

Investigation into the composition of the GaN NPs is conducted through X-ray photoelectron spectroscopy (XPS). The spectra from XPS indicate the presence of gallium, nitrogen, oxygen, and carbon, as shown in FIGS. 10A-D. The presence of carbon is attributed to the methyl groups in the TMGa and to hydrocarbon contamination from the vacuum pump, XPS instrument, and air. Based on the Ga 2p3/2 peak, while the majority of the Ga in the NPs is paired with N, there is also a small amount of oxide, as well as some Ga—Ga coupling, indicating that the samples are Ga rich at the surface. To analyze further, the surface of the GaN NPs are probed with Fourier-transform infrared spectroscopy (FTIR). FTIR spectra are collected immediately following deposition and at several time intervals following deposition, as shown in FIG. 11. The initial spectrum indicates strong absorptions corresponding to Ga—N, NH, and C—H bonds. The photoluminescence (PL) spectrum of the GaN NPs is measured with a UV-VIS spectrometer. Samples are excited with a broadband deuterium lamp (Thorlabs SLS204). A band-pass filter is used to create a peak excitation centered at 255 nm. From the XPS analysis, it is clear that a stoichiometric ratio of 1:1 Ga:N is not present in the sample. This imbalance may introduce defects into the lattice or at the surface, leading to non-radiative recombination of carriers.

Figure 12:
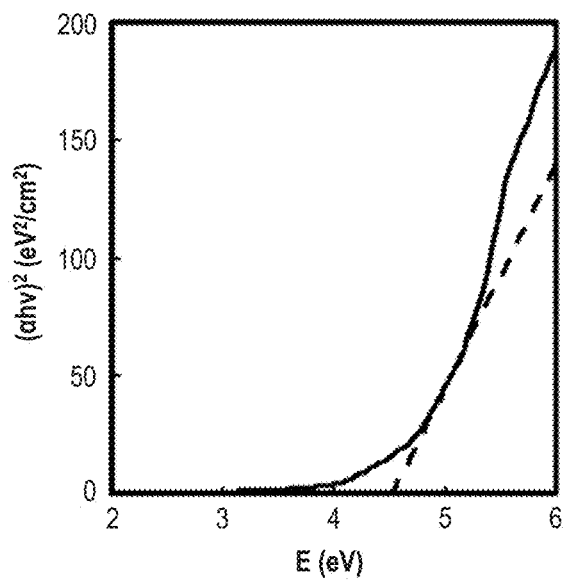
FIG. 12 is a tauc plot from GaN NPs as calculated from optical absorption measurements. The extrapolated band gap is 4.4-4.5 eV, indicating a significant size-related shift from the bulk value of 3.4 eV.

The optical absorption of the NPs dispersed in ethanol and resulting Tauc plots indicate a bandgap between 4.4-4.5 eV, with a representative plot shown in FIG. 12. The bulk bandgap of wurtzite GaN is 3.4 eV, meaning that the GaN NPs seem to be exhibiting quantum confinement. There are several estimates for the Bohr exciton radius of GaN, with reports as small as 2.8 nm. Based on the XRD results, these NPs have at least one dimension, which is confined even at this small onset of quantum confinement. In addition, several other reports on optical properties of GaN NPs indicate bandgaps between 4-5 eV, with shifts to higher energies occurring for NPs with diameters below 11 nm.

Figure 13A:
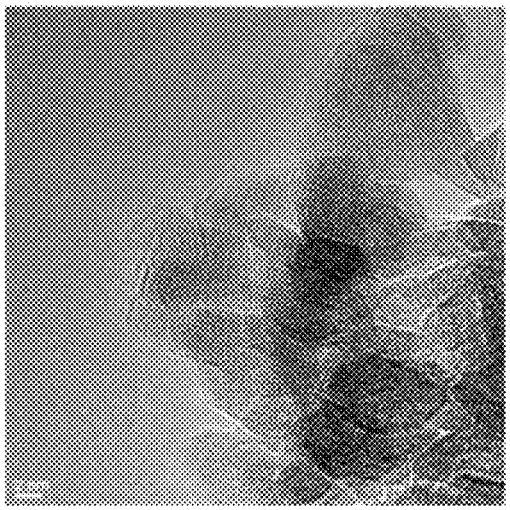
FIGS. 13A-13C are TEM images showing the progression of synthesized GaN NPs from amorphous at low power (130 W, FIG. 13A), to crystalline at moderate power (150 W, FIG. 13B), and back to amorphous at even higher power (175 W, FIG. 13C).
Figure 13B:
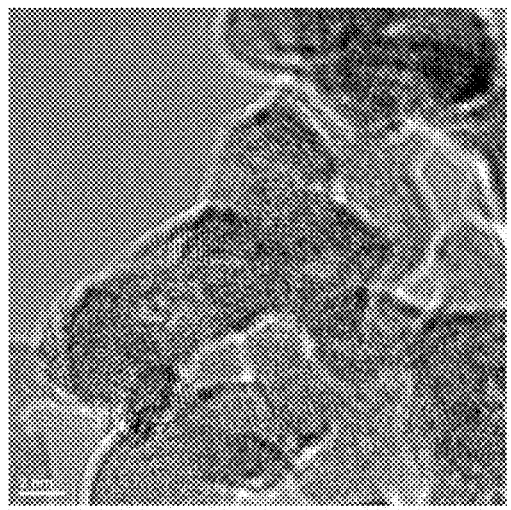
Figure 13C:
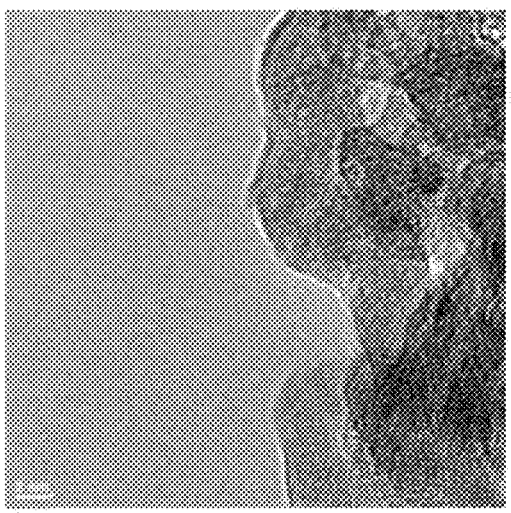

Control between amorphous and crystalline GaN NPs is also demonstrated. By varying the power, a shift can be observed from amorphous to crystalline NPs. FIGS. 13A-C show TEM images of NPs synthesized at 130 W, 150 W, and 175 W. At 130 W, NPs are primarily amorphous with few crystalline NPs present. When NPs are synthesized at 150 W, the NPs then exhibit a crystalline structure. At 175 W, NPs return to an amorphous structure, along with a reduction in the yield of the deposition. This is consistent with prior reports on Si NPs, for which a transition between amorphous and crystalline structure occurred as a function of the supplied power. The power parameter at a given frequency primarily influences the plasma density ($n_e$, $n_i$), which dictates to a large degree the heating of the NPs in the plasma and, thus, the ability of the nanostructure to become crystalline or remain amorphous. It is notable that this transition is observable for GaN NPs, as the melting temperature of bulk GaN is 2773 K. This means that even though the plasma remains nonthermal and the gas species are near room temperature, the electron-ion recombination and other reactions, such as hydrogen-based reactions, at the GaN NP surfaces are sufficient to bring the NP temperatures well above the gas temperature. These high temperatures may in turn be the reason behind the non-stoichiometric elemental composition of the GaN NPs—while the TEM results point to highly crystalline GaN NP cores, the high NP temperature during the process (especially at the surface, where the reactions with plasma species occur) can lead to bond reorganization and additional hydrogen incorporation.

One of the attractive features of NPs is their size-dependent properties. By controlling the residence time of the GaN NPs in the plasma, it is possible to control the size of the NPs. The residence time is a function of the pressure, overall flow rate, and plasma volume. Here, the residence time is controlled by adjusting the plasma volume and overall flowrate. For the samples analyzed above (XRD and TEM data in FIGS. 7 and 10A-D), the residence time was 51 ms. By increasing the residence time, an increase is observed in the NP diameter, as evaluated using TEM analysis. Table 1 below shows average NP diameters correlated with residence time. GaN NP size is controllable over a range of approximately 3-5 nm.

TABLE 1

Relationship between residence time in the plasma and average diameter of synthesized NPS.

| Residence Time (ms) | Nanoparticle Size (nm) |
|---|---|
| 194 | 4.9 |
| 73 | 3.5 |
| 51 | 3.2 |

Figure 14:
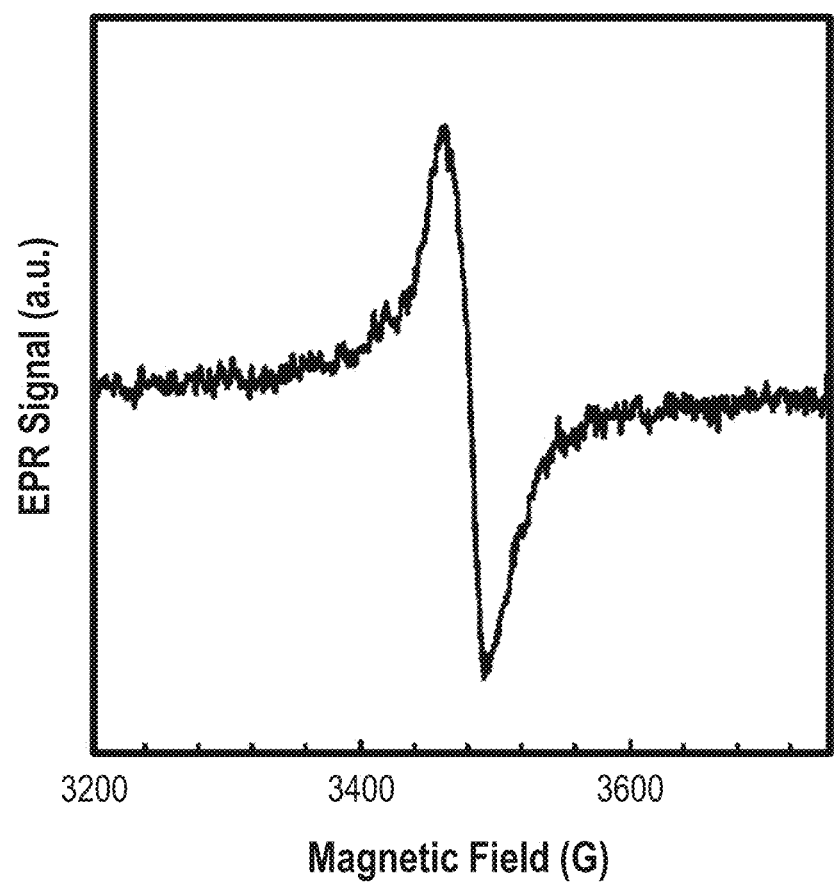
FIG. 14 is graph showing an electron paramagnetic spin resonance (EPR) spectroscopy. A single prominent defect with a g-value of 2.008±0.0005 is observed.

Defects at the surfaces of NPs can present a number of challenges in terms of maximizing optical properties, as they can induce non-radiative recombination routes for the excitons induced by UV irradiation. In many NP materials systems (Si, InP, GaP, and Group II-VI chalcogenides), surface passivation has proven crucial in eliciting and maintaining high-efficiency luminescence and other desirable improvements in performance. To better understand the surface defects observed in the synthesized GaN NPs, electron paramagnetic spin resonance (EPR) spectroscopy, a method which identifies charged defects in semiconductors, is performed. Samples are exposed to microwave radiation and then subjected to a scanned magnetic field—causing energy-level splitting depending on free electron spins in the sample. The combination of applied field and radiation energy leads to resonance of the free electron, resulting in an absorbance spectrum. The g-value relates the applied field and radiation energy for a particular absorption and can provide information about the type and surrounding environment of the free electrons detected. For GaN, there is little recent work employing EPR for defect identification, although there are some prior studies indicating the g-values for certain defects in bulk GaN. In the tests here, one prominent defect at a g-value of 2.008±0.0005 is identified, as shown in FIG. 14. G-values around 2.008 have been associated with nitrogen and gallium vacancies. Although more investigations into the link between observed paramagnetic defects in GaN NPs and the physical and optoelectronic performance of the NPs are needed, this evidence underscores the need to maintain a stoichiometric NP from the core through the surface in order to reduce defects and maximize performance.

For other materials, surface treatments such as colloidal chemical stabilization, graded shell growth, and annealing processes have demonstrated a remarkable influence over the reduction in surface defects and a corresponding increase in PL efficiency and are, therefore, key future directions to investigate with nitride NPs. Further, the in-flight NP tunability inherent to the RF plasma route paired with inertial impaction directly from the reactor mean that these GaN NPs can be deployed as stable coatings and as layers in electronics, such as transistors directly from the gas-phase.

The demonstrated RF nonthermal plasma route to produce GaN NPs allows for size and crystallinity control, which shows great promise towards producing these NPs using a flow-through, sustainable method and sidestepping substrate issues associated with conventional epitaxial growth. In addition, the NPs can be inertially impacted onto substrates, consistent with direct integration into devices. As such, the method illustrated here provides a wide variety of diode, transistor, and coating applications, owing to the easy synthesis, tunability, and direct deposition onto virtually any substrate.

Example 2

New pathways to novel classes of nanocrystal- and nanocluster-based devices based on nitride semiconductors that have efficient and tunable light emission for PV and LED applications across a massive range are provided. Nanoparticles and nanocrystals (also known as quantum dots) have a tremendous impact on energy production, energy efficiency, communications, medicine, and beyond. Nanomaterials are inexpensive to produce, exhibit novel and tunable optoelectronic properties, and are compatible with a range of devices including flexible or stretchable light-emitting diodes (LEDs), solar cells, and electronics. In particular, solar photovoltaics (PVs) and LEDs have the potential to significantly reduce our environmental impact by mitigating greenhouse gas emissions, and their deployment in light emission applications is increasing in part thanks to advances in devices based around organic semiconductors and Group II-VI chalcogenide nanocrystals. These newer materials have driven rising efficiencies and new manifestations of these energy devices, and are currently being commercialized in next-generation display technologies—but they also present significant challenges. For example, with both organic and II-VI semiconductors, it is not yet possible to completely span the spectral range from UV through IR. Further, they require elements such as Ir, Pt, Cd, and Pb—which prevents wide-scale adoptability due to high cost and potential toxicity. To fully enable the widespread adoption of these devices, new materials and methods for depositing light-harvesting and light-emitting materials directly into device architectures are needed to enhance performance and further lower costs while enabling additional functionality.

Gallium nitride (GaN) and indium nitride (InN) single-crystalline materials for LED and other applications are now provided. The development of low-cost fabrication of these GaN and InN in nanocrystal (NC) form is desirable in a number of fields. GaN and InN may be particularly useful in high performance LEDs and PV absorbers, respectively. Indeed, the combination of these materials as an alloy $(In_{1-x}Ga_xN$, where $0 \leq x \leq 1)$ provides a massive bandgap range from the ultraviolet for GaN, all the way through the spectrum to the deep infrared for InN, which is further expanded by the potential for quantum confinement. The use of low-cost NCs additionally allows unique applications for intermixing, extreme UV and tailored VIS/NIR emission for medical applications and lighting, and novel device architectures with altered spin dynamics—all attributes that are challenging to achieve using traditional bulk materials.

The current technology provides a shift in paradigm for achieving energy devices with tunable optical absorption and emission. Here the synthesis of high quality nitride nanocrystals (via high effective reaction temperatures in a plasma) with surface processing and device fabrication is unified into a streamlined deposition process as described above (and further described in this example), while exploring a range of novel device architectures to exploit NC performance. Combined plasma-based synthesis and deposition strategies are used to controllably create freestanding nitride nanomaterials and to deposit them directly from the gas-phase to fabricate exciting new manifestations of PVs and active matrix LEDs, among other devices. This method overcomes the broader barriers to fabricating devices with NCs from solution due to difficulties in composition control, limited thermal range to generate high quality crystals, and concerns for solvent orthogonality. The method also presents more sustainable processing and materials choices beyond what is available via the currently available organic and inorganic alternatives. The method offers tunable physical and optoelectronic NC properties in the most impactful spectral range that is a versatile and low-cost and that uses exclusively (if desired) thin-film vapor-phase methods. By demonstrating this pathway for InN, GaN and alloy $(In_{1-x}Ga_xN$, where $0 \leq x \leq 1)$ NCs for optoelectronic devices, the method represents a new platform for realizing a one-step synthesis and solvent-free deposition approach for patterned nanostructured light-emitting devices and other all-inorganic NC-based applications with massive tunability. This approach overcomes the low effective synthesis temperature of solution processing, which has likely hindered previous efforts and also enables device design freedom as the NCs can be deposited on practically any surface, including stretchable substrates, something not easily achievable with single crystals and crystalline quantum wells.

GaN NCs are synthesized in an RF plasma reactor. GaN NCs can be formed using, for example, trimethyl Ga (TMGa, diluted in Ar) and $NH_3$ as precursors. This process yields size-tunable NCs with a wurtzite crystal structure and that exhibit emission in the UV.

Figure 15:
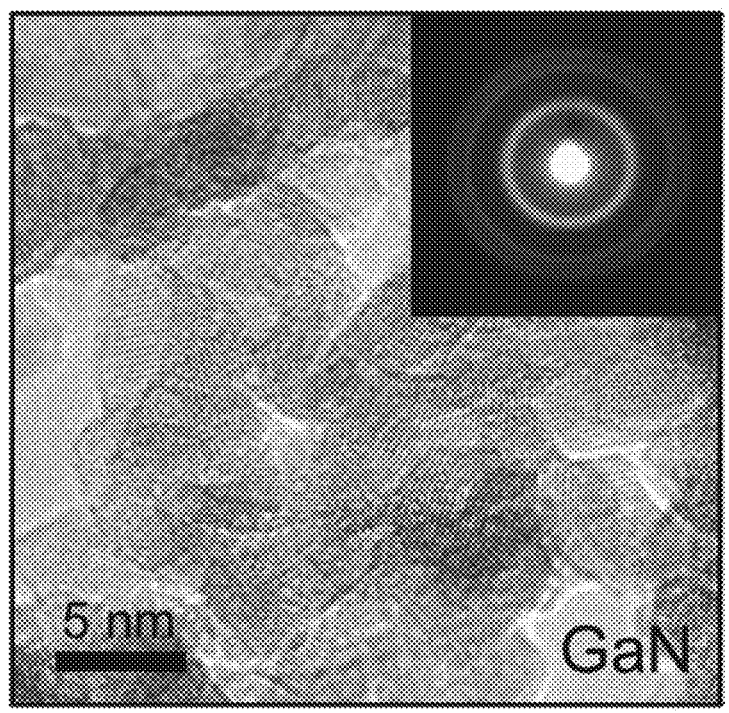
FIG. 15 is a micrograph of a plasma-synthesized GaN nanocrystals. The insert shows an electron diffraction pattern corresponding to the nanocrystals.

FIG. 15 shows a transmission electron micrograph of GaN NCs made in the RF plasma reactor. The GaN NCs display good crystalline ordering, which is confirmed with electron diffraction. Stoichiometric analysis using X-ray photoelectron spectroscopy (XPS) further confirms the formation of stoichiometric GaN. The nonthermal plasma reactor is a powerful tool for synthesizing a variety of nitride based NCs, including In-doped GaN NCs.

Figure 16:
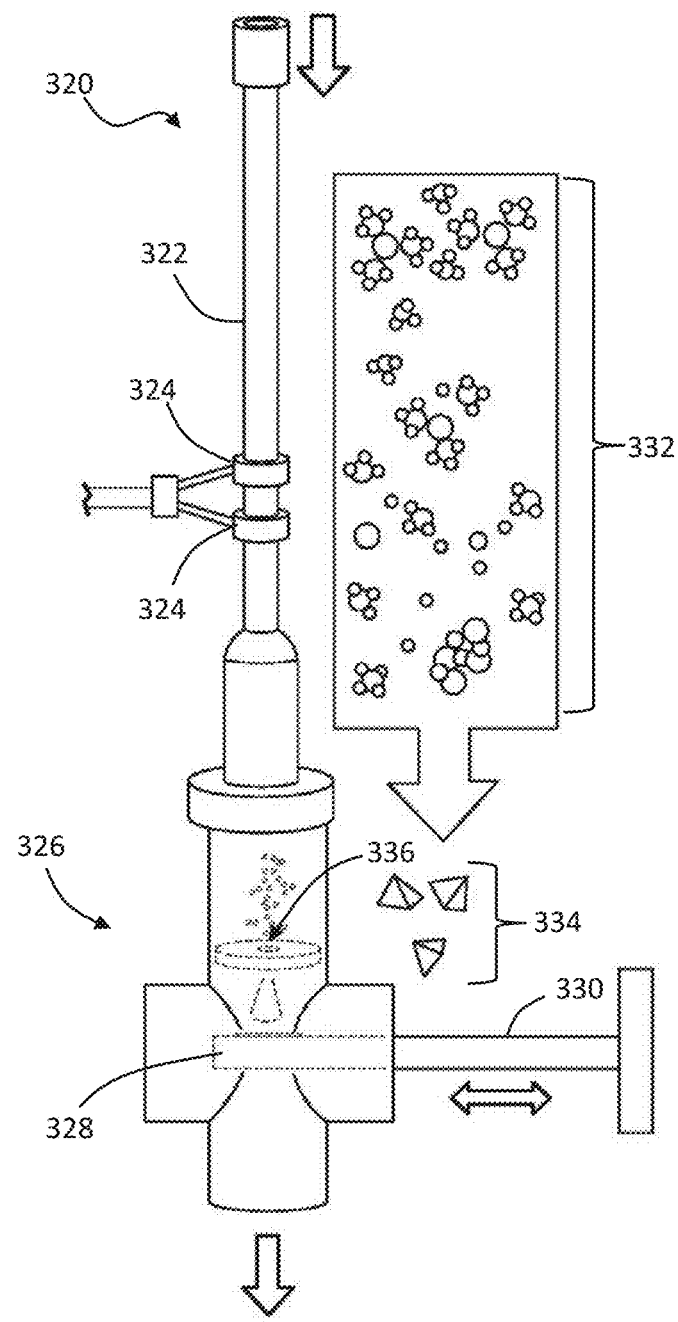
FIG. 16 is a schematic of a plasma reactor in inertial impaction in accordance with various aspects of the current technology.

The advantages in using the plasma reactor include (a) size monodispersity, (b) controllable properties such as NC size, (c) greater flexibility in synthesis of alloyed crystals without needed to design new reaction kinetics, and (d) the ability to deposit the NCs from the gas phase without removal from the reactor or additional processing steps. Plasmas also allow rapid, continuous (flow-through) processing and low cost of operation. In general, a radiofrequency (RF) nonthermal plasma reactor is comprised of a borosilicate glass tube through which vapor-phase precursors and carrier gases are flown at reduced pressure (typically from about 150 to about 3000 Pa). Dual ring electrodes encircle the tube externally and are supplied with RF power, which excites a plasma, causing the precursors to dissociate. The precursor fragments cluster together and grow to form nanoparticles. The controllable parameters of the reactor include the pressure, tube dimensions, residence time, and gas flowrate, which determine NC size; the input power, which determines the crystallinity of the nanoparticles; and the precursor concentration, which governs both the size of the growing NCs and the production yield of the process. GaN and InN NC precursors based on $NH_3$ for nitrogen, and TMGa and TMIn for Ga and In, respectively, are utilized. A schematic of a reactor 320 is depicted FIG. 16, which is used to generate the GaN NCs shown in FIG. 15. The reactor 320 is similar to the reactor 60b of FIG. 3 and includes a reaction tube 322, and a pair of power-supplying ring electrodes 324 disposed around the reaction tube 322 A deposition chamber 326 is positioned below the reactor 320 and carries a substrate 328, which is translatable by a pushrod 330. Argon, NH3, TMGa/TMIn 332 are reacted in plasma generated in the reactor 320 and nanocrystals 334 are generated, which are deposited on the substrate 328 from the gas phase.

By closely controlling the pressure in the reactor 320 (via size of an orifice 336 in the deposition chamber 236 and gas flowrates) and the hydrogen density (by adding supplemental hydrogen gas into the plasma), the internal GaN and InN nanoparticle temperature can be fine-tuned to optimize crystalline NCs, eliminate defects, and control the crystal phase of the NCs by coupling the nanoparticle temperature in the plasma to the quenching rate of the NCs using reactor engineering and quenching gas flow dynamics. In-flight plasma diagnostics are used to measure the plasma characteristics, and multi-plasma-based experiments are also used to gauge the reaction temperatures required for GaN and InN crystallization based on these in-situ diagnostics. This technique combines optical emission spectroscopy on the plasma to estimate electron temperatures, electrical probe measurements to measure ion density, in-flight FTIR measurements on both the NCs and the gas, and NC characterization methods.

Figure 17:
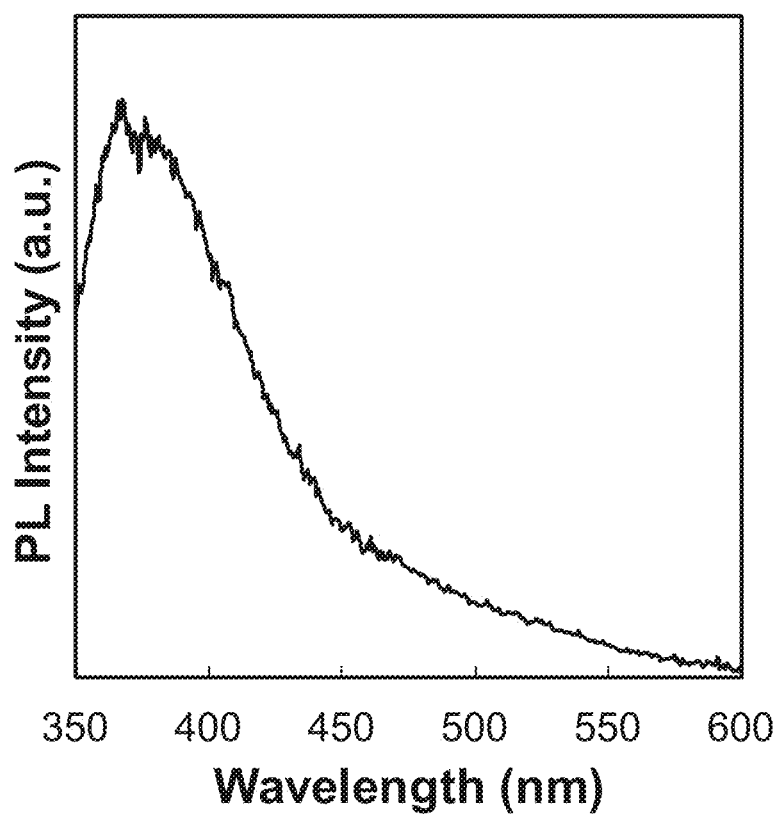
FIG. 17 shows a photoluminescence emission spectrum of GaN NCs in oleic acid, indicating band-edge luminescence and peak emission at about 375 nm (background subtracted).

The emission characteristics of the NCs reveals connections between physical and optoelectronic properties. Here, achieved are GaN and InN NCs with luminescence across a large range around the two separate materials (3.4 eV for GaN to 0.7 eV for InN) and extending it even deeper into the UV (greater than 3.5 eV) through quantum confinement. For example, FIG. 17 shows band-gap emission for GaN NCs with an average diameter of about 3.5 nm. Quantum confinement describes size-based changes to the optoelectronic properties of semiconductor nanomaterials. For a wide range of semiconductor NCs, once the diameter of the crystal decreases below the material's Bohr exciton radius (effective size of the coulombically charged excited-state electron and hole), the bandgap of the material is modulated (widened), causing a shift in the light absorption and emission from the NCs. Quantum confinement leading to a shift in emission energy occurs in both direct- and indirect-bandgap semiconductors. Therefore, luminescence properties of the NCs including emission spectrum, quantum yield and radiative rates, are measured and linked to particle size, stoichiometry, and defect contents. Particle size can be tailored from at least about 20 nm to about 1 nm via changes in flowrate (limited by physical constraints) to 25-500 sccm. The ability to freely tailor particle size leads to the ability to exploit quantum confinement to provide yet another control parameter for adjusting the luminescence and absorption from these NCs. In fact, there is still controversy around the Bohr exciton radius in GaN, and as such, quantum confinement effects observed via this synthesis route offer an important scientific contribution to our understanding of confinement in nitride NCs and offer an important alternative to 2D quantum wells.

Figure 18:
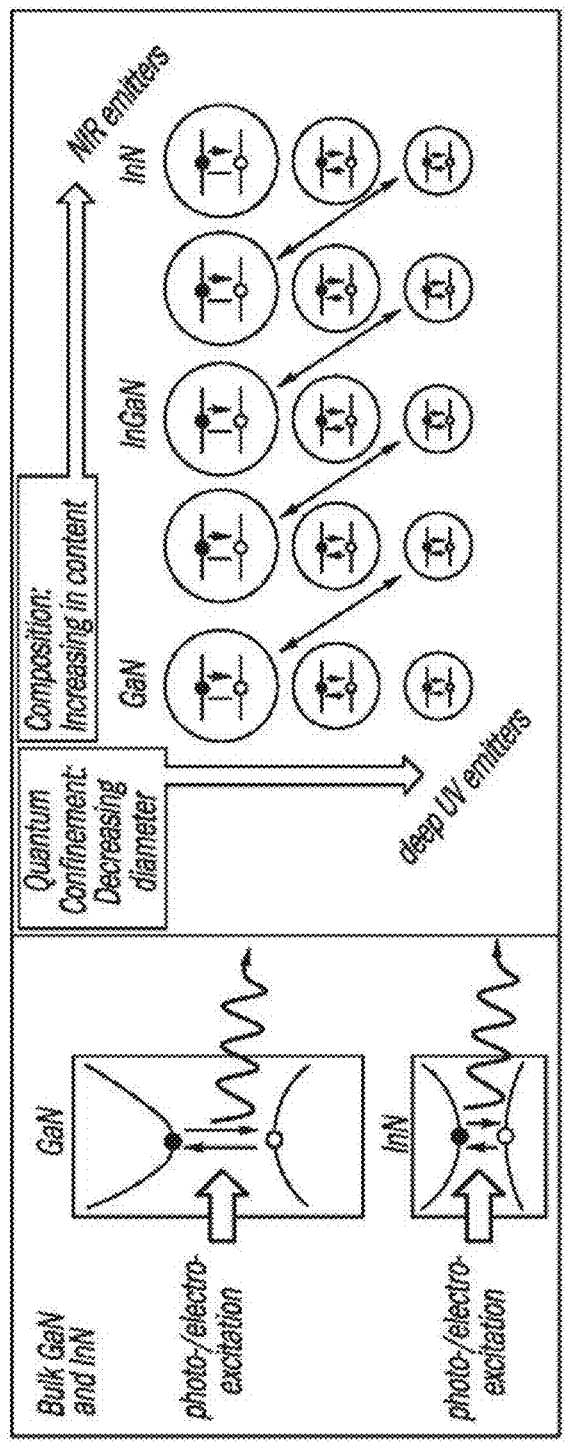
FIG. 18 shows bandgap modulation of GaN/InN NCs from bulk nitrides (left) via composition control and quantum confinement (right). NCs can be made with the same bandgap/color but with differing size.

Also, the ability to both p- and n-dope the NCs is an important consideration for creating optoelectronic devices, considering the difficulty noted with other processing. For GaN and InN NCs, doping is possible by using small flows of vapor-phase precursors for magnesium (Mg) and other dopants such as oxygen and silicon (additional dopants are described herein) that change the carrier concentrations of these nitride NCs and nanostructuring can also act to effectively tune frontier orbitals and doping as shown in FIG. 18. Dopants including Al, Mg, etc., as well as a range of other surface ligands, and provide additional mechanisms to increase the spectral range even further (i.e., alloys of AlGaN and AlInN).

The nanocrystals and nanoclusters enable a range of optoelectronic devices from the GaN, InN, and $In_{1-x}Ga_xN$ (0≤x≤1) NC films, as shown in FIGS. 19A-C. These devices include UV LEDs, single-color LEDs, multicolor LEDs, and single/multi-junction photovoltaic cells constructed from combinations of the NC materials. UV and blue LEDs are the platforms on which many white-light LEDs are constructed, but they also serve an important role in biomedical applications. UV and ultra-deep UV light can be an effective sterilizing agent, and is used for water sterilization as well as germicidal treatment of biofilms. UV LEDs can also be included in biosensors to determine neuronal activity and other biological processes, enabling understanding and monitoring health in action. Extreme UV (EUV) solid-state lasers with quantum-confined GaN and AlN are contemplated to replace expensive ArF excimer lasers for sub-15 nm lithography. NIR emission, as produced using the InN and $In_{1-x}Ga_xN$ (0≤x≤1) NCs, is also important in biomedical applications as NIR light can penetrate tissue, making it valuable for biological imaging (both ex- and in-vivo, since nitrides are biologically compatible) and even wound therapy to pinpoint tissue transparency windows. For example, FIG. 19A shows a hybrid NC LED 350 comprising a glass substrate 352 and the following layers sequentially disposed above the glass substrate 352: an ITO layer 354, a $MoO_3$ layer 356, a $In_{1-x}Ga_xN$ (0≤x≤1) NC layer 358, an electron transport layer (ETL) 360, and a Ti/Au, Al, Ag layer 362 FIG. 19B shows a NC PV 370 comprising a glass substrate 372 and the following layers sequentially disposed above the glass substrate 372: a ITO layer 374, an ETL layer 376, a $In_{1-x}Ga_xN$ (0≤x≤1) NC layer 378, a $MoO_3$ layer 380, and an Au layer 382. FIG. 19C shows a flexible LED/PV 390 comprising a flexible PET substrate 392 and the following flexible layers sequentially disposed above the flexible PET substrate 392: a PEDOT/$MoO_3$ layer 394, a $In_{1-x}Ga_xN$ (0≤x≤1) NC layer 396, and a Ti/Au, Al layer 298.

Example 3

In this example, a system, including a reactor, shown in FIG. 20 was utilized. This system is prepared as the system 10 shown in FIG. 1, but does not include an additional dopant. Trimethyl Indium (TMIn) and ammonia ($NH_3$) precursors combined with an argon background gas are flown to the reactor. The argon flow rate is 90 sccm and the precursor gas flow rates of TMGa and $NH_3$ are ~1 and 65 sccm, respectively. Three ring electrodes are placed around the glass reactor tube (0.375" outer diameter and 0.275" inner diameter) similar to reactor 60b of FIG. 2. The central electrode is supplied with power from an RF power supply at 13.56 MHz (T&C AG0313) and a matching network (MFJ-989D) to maximize power delivery, while the upper and lower electrodes are grounded. Supplied power is held at 75 W (75 W forward and 0 W reflected) and the pressure is maintained between 6 and 8 torr. Flow conditions are as follows 90 sccm for Ar, 65 sccm for $NH_3$, and Ar flow was used to push TMIn. Pressure conditions are as follows: base pressure is 87 mTorr, initial pressure is 7.135 Torr, and final pressure is 7.576 Torr. GaN NPs are collected downstream of the reactor via inertial impaction of the NPs onto a substrate.

InN may crystallize in the wurtzite, zinc blende, or rock salt phase, where the wurtzite phase is the stable phase at ambient conditions. The crystal structure of the synthesized InN NPs is investigated by use of transmission electron microscopy (TEM) and image processing software (Image J). Measurement of the atomic plane spacing indicates the presence of InN NPs in good agreement with wurtzite crystal phase, with average spacing of 2.4±0.3 angstroms. TEM images are shown in FIGS. 21A-C with the electron diffraction pattern as inset in FIG. 21C. Image J software was also used to measure the average diameters of the InN NPs, as shown in FIG. 22. The average diameter is 3.6 nm±0.5 nm.

Investigation into the surface composition of the InN NPs is probed with Fourier-transform infrared spectroscopy (FTIR). FTIR spectra are collected immediately following deposition as shown in FIG. 23. The initial spectrum indicates strong absorptions corresponding to In—N and N—H bonds as well as some oxidation in the form of O—H, In—O, and N—O bonds.

FIG. 24A shows a photograph of InN NPs deposited on a stainless steel mesh filter in room light, where the InN NPs are visible as an orange powder. FIG. 24B shows a photograph of the InN NPs illuminated with a blue-UV flashlight. Red emission is seen around an edge is circled.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of making nanoparticles comprising a semiconducting nitride, the method comprising:
    reacting precursors in a gas phase to form the nanoparticles comprising the semiconducting nitride, the precursors comprising at least one of a gallium (Ga) precursor or an indium (In) precursor, and a nitrogen (N) precursor,
    wherein the semiconducting nitride is $In_{1-x}Ga_xN$, where $0 \le x < 1$.

2. The method according to claim 1, wherein the reacting occurs in a plasma.

3. The method according to claim 2, wherein the plasma is formed within a plasma reactor.

4. The method according to claim 3, wherein the reacting comprises:
    introducing a carrier gas into the plasma reactor, the plasma reactor comprising a reactor tube and at least one ring electrode that encircles the plasma reactor;
    introducing the precursors into the plasma reactor; and
    applying radiofrequency (RF) power to the at least one ring electrode to cause the plasma to form in the reactor tube.

5. The method according to claim 1, wherein the Ga precursor comprises trimethygallium (TMGa), $GaX_3$ where X is F, Cl, I, Br, or a combination thereof, Ga metal, or a combination thereof; the In precursor comprises trimethylindium (TMIn), $InX_3$ where X is F, Cl, I, Br, or a combination thereof, In metal, or a combination thereof; and the N precursor comprises ammonia ($NH_3$), $N_2$, or a combination thereof.

6. The method according to claim 1, wherein the nanoparticles comprise nanocrystals.

7. The method according to claim 3, comprising reacting the Ga precursor, the In precursor, and the N precursor in the plasma reactor.

8. The method according to claim 1, wherein the nanoparticles are substantially free of ligands.

9. The method according to claim 1, further comprising:
    forming a layer on the nanoparticles in a gas phase, wherein the layer defines a nanoparticle shell that has a larger bandgap than the nanoparticles.

10. The method according to claim 9, wherein the nanoparticle shell comprises In-doped GaN, wherein the In-doped GaN has less In than the nanoparticles.

11. The method according to claim 1, wherein the precursors further comprise a dopant precursor selected from the group consisting of Ca, Sr, Ba, Si, Ge, Sn, C, Al, Zn, P, Sb, As, and combinations thereof, and wherein the semiconducting nitride includes the dopant at a concentration of greater than 0 to less than or equal to about 10 mol. % based on the total moles of the Ga, In, N, and dopant in the semiconducting nitride nanoparticles.

12. The method according to claim 1, further comprising:
    bonding a ligand to the nanoparticles, wherein the ligand is a passivating ligand, a solubilizing ligand, or a combination thereof.

13. The method according to claim 1, further comprising:
    depositing the nanoparticles comprising the semiconducting nitride as a layer onto a substrate, the substrate comprising an electrically semiconductive material or an electrically conductive material.

14. The method according to claim 13, wherein the substrate comprises, gold (Au), silver (Ag), copper (Cu), platinum (Pt), tin (Sn), aluminum (Al), iron (Fe) gallium (Ga), indium (In), thallium (Tl), antimony (Sb), bismuth (Bi), titanium (Ti), molybdenum (Mo), niobium (Nb), nickel (Ni), chromium (Cr), magnesium (Mg), silicon (Si), GaN, steel, foils thereof, poly(3,4-ethylenedioxythiophene) polystyrene sulfonate (PEDOT), poly(styrene sulfonate)-doped PEDOT (PEDOT/PSS), ZnO, CdTe, indium tin oxide (ITO), ITO coated glass, $SiO_2$, quartz, glass, sapphire, alumina, polyethylene, polyethylene terephthalate, nylon, polystyrene, polyvinyl chloride, polymethyl methacrylate, polylactic acid, silicone, polydimethylsiloxane (PDMS), and combinations thereof.

15. The method according to claim 13, further comprising:
    sintering the layer of the nanoparticles.

16. The method according to claim 1, further comprising:
    depositing the nanoparticles onto an electrically insulating substrate.

17. The method according to claim 1, further comprising:
    collecting the nanoparticles;
    combining the nanoparticles in a liquid to form a solution or suspension;
    casting the solution or suspension on a substrate; and
    removing at least a portion of the liquid to generate a layer of the nanoparticles on the substrate.

18. The method according to claim 1, wherein the nanoparticles have an average diameter of greater than or equal to about 0.5 nm to less than or equal to about 1000 nm.

19. The method according to claim 1, further comprising:
    incorporating the nanoparticles into a diode, a circuit, a sensor, a rectifier, a photocoupler, a photocatalyst, a catalyst, a photovoltaic cell, a photodetector, a photoconductor, a light emitting diode (LED), a laser, a memory, a transistor, a coating, or a medical coating.

20. A structure comprising:
    a substrate;
    a layer comprising nanoparticles on the substrate; and
    an electrode in electrical communication with the layer,
    wherein the nanoparticles comprise a semiconducting nitride having the formula $In_{1-x}Ga_xN$, where $0 \le x < 1$.

21. The structure according to claim 20, wherein the nanoparticles are substantially free of ligands.

22. The structure according to claim 20, wherein the layer is in direct contact with the substrate.

23. The structure according to claim 20, further comprising:
    an intermediate layer disposed between the substrate and the layer.

24. The structure according to claim 20, wherein the substrate is electrically insulating.

25. The structure according to claim 20, wherein the substrate is electrically semiconductive or electrically conductive.

26. The structure according to claim 20, wherein the structure is a part of a diode, a circuit, a sensor, a rectifier, a photocoupler, a photocatalyst, a catalyst, a photovoltaic cell, a photodetector, a photoconductor, a light emitting diode (LED), a laser, a memory, a transistor, a coating, or a medical coating.

27. The structure according to claim 20, wherein the structure is a part of a light emitting diode (LED) that emits light having a wavelength greater than or equal to about 150 nm to less than or equal to about 2000 nm.

28. A system comprising:
a carrier gas,
a nitrogen precursor,
an indium precursor,
a gallium precursor,
a reactor configured to generate a plasma, and
conduits for transporting the carrier gas, the nitrogen precursor, and the indium precursor to the reactor,
wherein the system is configured to generate nanoparticles comprising $In_{1-x}Ga_xN$, where $0 \leq x < 1$.

29. The system according to claim 28, wherein the carrier gas carries the indium precursor through the conduits.

30. The system according to claim 28, wherein $0 < x < 1$.

31. The system according to claim 28, wherein the system is configured to form a semiconducting nitride from the nitrogen precursor, and at least one of the gallium precursor or the indium precursor in the reactor.

32. The system according to claim 28, further comprising:
a deposition chamber including a translatable substrate,
wherein the system is configured so that nanocrystals formed in the reactor are directly deposited onto the translatable substrate from a gas phase.

33. The system according to claim 28, wherein the carrier gas is the nitrogen precursor.

* * * * *